United States Patent [19]
Hayashi et al.

[11] Patent Number: 6,004,839
[45] Date of Patent: Dec. 21, 1999

[54] SEMICONDUCTOR DEVICE WITH CONDUCTIVE PLUGS

[75] Inventors: Yoshihiro Hayashi; Nobuhiro Tanabe; Tsuneo Takeuchi; Shinobu Saito, all of Tokyo, Japan

[73] Assignee: NEC Corporation, Tokyo, Japan

[21] Appl. No.: 08/804,112

[22] Filed: Feb. 20, 1997

Related U.S. Application Data

[62] Division of application No. 08/754,808, Nov. 21, 1996.

[30] Foreign Application Priority Data

Jan. 17, 1996 [JP] Japan ................................. 8-005490

[51] Int. Cl.$^6$ .................... H02L 21/8238; H02L 21/8242
[52] U.S. Cl. ...................... 438/210; 438/240; 438/241; 438/253
[58] Field of Search .................... 438/396, 397, 438/253, 254, 3, 200, 210, 240, 241

[56] References Cited

U.S. PATENT DOCUMENTS

| | | | |
|---|---|---|---|
| 4,439,270 | 3/1984 | Powell et al. | 257/734 |
| 4,577,390 | 3/1986 | Haken | 438/210 |
| 4,617,193 | 10/1986 | Wu | 257/758 |
| 4,994,893 | 2/1991 | Ozaki et al. | 257/763 |
| 5,055,966 | 10/1991 | Smith et al. | 257/774 |
| 5,187,122 | 2/1993 | Bonis | 438/210 |
| 5,252,504 | 10/1993 | Lowrey et al. | 438/210 |
| 5,281,151 | 1/1994 | Arima et al. | 257/778 |
| 5,320,976 | 6/1994 | Chin et al. | 438/210 |
| 5,350,705 | 9/1994 | Brassington et al. | 257/306 |
| 5,352,623 | 10/1994 | Kamiyama | 438/240 |
| 5,374,578 | 12/1994 | Patel et al. | 438/3 |
| 5,381,040 | 1/1995 | Sun et al. | 257/754 |
| 5,385,857 | 1/1995 | Solo De Zaldivar | 438/253 |
| 5,399,890 | 3/1995 | Okada et al. | 257/306 |
| 5,414,655 | 5/1995 | Ozaki et al. | 257/303 |
| 5,436,477 | 7/1995 | Hashizume et al. | 257/306 |
| 5,438,008 | 8/1995 | Ema | 438/241 |
| 5,439,840 | 8/1995 | Jones, Jr. et al. | 438/240 |
| 5,495,117 | 2/1996 | Larson | 257/306 |
| 5,504,029 | 4/1996 | Murata et al. | 438/241 |
| 5,519,239 | 5/1996 | Chu | 257/774 |
| 5,567,636 | 10/1996 | Jones, Jr. | 438/3 |
| 5,578,867 | 11/1996 | Argos | 257/295 |
| 5,583,068 | 12/1996 | Jones, Jr. et al. | 437/52 |
| 5,614,439 | 3/1997 | Murooka et al. | 2257/758 |
| 5,616,959 | 4/1997 | Jeng | 257/774 |
| 5,631,182 | 5/1997 | Suwanai et al. | 438/241 |
| 5,675,185 | 10/1997 | Chen et al. | 257/774 |
| 5,686,760 | 11/1997 | Miyakawa | 257/751 |
| 5,716,875 | 2/1998 | Jones, Jr. et al. | 438/3 |
| 5,726,083 | 3/1998 | Takaishi | 438/210 |
| 5,759,889 | 6/1998 | Sakao | 438/241 |

FOREIGN PATENT DOCUMENTS

| | | | |
|---|---|---|---|
| 63-278363 | 11/1988 | Japan | 257/306 |
| 3-167874 | 7/1991 | Japan | 257/306 |
| 06-120447 | of 1994 | Japan | . |
| 6-132479 | 5/1994 | Japan | 257/295 |

*Primary Examiner*—Peter Toby Brown
*Assistant Examiner*—Toniae M. Thomas
*Attorney, Agent, or Firm*—Sughrue, Mion, Zinn, Macpeak & Seas, PLLC

[57] ABSTRACT

In a method of manufacturing a semiconductor device, a CMOS section composed of an N-channel MOS transistor and a P-channel MOS transistor and a memory section composed of at least a transfer gate MOS transistor is formed on a substrate. A plurality of conductive plugs is formed to penetrate a laminate insulating film to the MOS transistors. The laminate insulating film is composed of a first insulating film and a second insulating film. A capacitor section is formed on the laminate insulating film and the capacitor section is composed of an upper electrode, a dielectric film and a lower electrode. A third insulating film is formed on the laminate insulating film and the capacitor section. A wiring pattern is formed on the third insulating film to partially penetrate the second insulating film connect to the plurality of conductive plugs. A wiring pattern may be disposed in the laminate insulating film to connect at least two of the plurality of conductive plugs.

19 Claims, 13 Drawing Sheets

SEMICONDUCTOR DEVICE WITH CONDUCTIVE PLUGS

This is a divisional of application Ser. No. 08/754,808 filed Nov. 21, 1996 pending Dec. 31, 1998.

BACKGROUND OF THE INVENTION

1. Field of the Invention

The present invention relates to a non-volatile semiconductor memory device which includes a dielectric film such as a ferroelectric thin film, and a method of manufacturing the same, and more particularly to a non-volatile semiconductor memory device using a heat-resistant metal and a method of manufacturing the same.

2. Description of Related Art

As a non-volatile semiconductor memory devices there is a ferroelectric semiconductor memory device in which a ferroelectric thin film having a polarization hysteresis is used for a capacitor section. In recent years, the ferroelectric semiconductor memory device is also required to be manufactured with a high density. As a result, the ferroelectric semiconductor memory device has been developed such that a transistor, wiring and a capacitor section are manufactured in a small size and contact holes are manufactured with high aspect ratio.

FIG. 1 is a circuit diagram illustrating a memory capacitor cell of a conventional ferroelectric semiconductor memory device using a ferroelectric thin film. The memory capacitor cell is composed of an NMOSFET as a transfer gate 1 and a ferroelectric capacitor 4. The ferroelectric thin film is provided between a charge storing electrode 2 and a plate electrode 3. The gate electrode of the NMOSFET 1 is connected to a word line 5. One of the diffusion layers of the NMOSFET is connected to a bit line 6 and the other diffusion layer is connected to the charge storing electrode 2 of the ferroelectric capacitor 4. The plate electrode 3 is connected to a plate line.

FIG. 2 is a circuit block diagram illustrating a general ferroelectric random access memory device (to be referred to as an FRAM device hereinafter). In this circuit of a fixed plate line voltage, the plate line voltage controller is not necessary (the plate lines are not shown). In the other circuit of a switched plate line voltage, a voltage controller circuit block is necessary (not shown). The FRAM device is composed of a memory circuit section 7 in which memory capacitor cells are arranged in row and column directions in a matrix manner and a CMOS logic circuit section 8 operable to read or write a data from or in each memory capacitor cell.

As shown in FIG. 1, because the transfer gate 1 of the memory capacitor cell is composed of an NMOSFET, only $n^+$ regions are formed as the diffusion layers in a portion of a silicon substrate corresponding to the memory circuit section. On the other hand, in the CMOS logic circuit section, the diffusion layers of a PMOSFET are $p^+$ regions and the diffusion layers of an NMOSFET are $n^+$ regions. That is, the $P^+$ diffusion regions and the $n^+$ diffusion region are mixedly present in a portion of the silicon substrate corresponding to the CMOS logic circuit section.

A first conventional example of such an FRAM device, is reported in "A Half-Micron Ferroelectric Memory Cell Technology with Stacked Capacitor Structure" by Onishi et al. in an international electron device conference (IEDM, Technical Digest, pp. 843–845, 1994). FIGS. 3A to 3D are cross sectional views of the FRAM device proposed by Onishi et al. in the manufacturing process. The method of manufacturing the FRAM proposed by Onishi will be described.

First, as shown in FIG. 3A, two adjacent NMOSFET transfer gates 1 in the memory circuit section 7 and a PMOSFET 9 and an NMOSFET 10 of the CMOS circuit section 8 are formed on a silicon substrate 11. Each MOSFET is separated from each other by element separation oxidation films 35. A first interlayer insulating film 12 is formed on the substrate 11 and the surface of the first interlayer insulating film 12 is flattened in a chemical mechanical polishing (CMP) method. Subsequently, an opening portions (to be referred to as a capacitor contact hole hereinafter) reaching the $n^+$ diffusion layer of each of the NMOSFET transfer gates 1 through the first interlayer insulating film 12 is formed in the memory circuit section. The $n^+$ polysilicon film is deposited on the first interlayer insulating film 12 by a CVD method such that the capacitor contact holes are filled with the polysilicon film. Then, the polysilicon film on the first interlayer insulating film 12 is removed in a dry etching back method. As a result, the $n^+$ capacity plugs 13 are formed in which the capacitor contact holes are filled with the $n^+$ polysilicon film.

Next, as shown in FIG. 3B, a Pt/TiN/Ti film which functions as the charge storing electrode is formed on the first interlayer insulating film surface by a sputtering method. Then, after a composite alkoxide solution composed of alkoxides of Pb, Ti and Zr is spin-coated on the charge storing electrode film, the substrate is annealed at the temperature of about 600° C. As a result, a PZT film $(Pb(Ti,Zr)O_3)$ having the thickness of about 3000 Å is formed. The PZT film is crystalized by lamp annealing method in which the substrate is heated at the temperature of 660° C. for 30 sec. Subsequently, the Pt/TiN/Ti/PZT film is patterned by an ECR high density plasma etching using a chloric gas. As a result, the structure is obtained in which the PZT film 14 is formed on the charge storing electrode 2 composed of the Pt/TiN/Ti film. Next, a $TiO_2$ barrier film (not illustrated) is deposited by a sputtering method on the substrate and then a $SiO_2$ film as the second interlayer insulating film 15 is deposited by a CVD method. A contact hole 16 (to be referred to as a plate electrode hole hereinafter) is formed to reach each of the PZT films 14 through the second interlayer insulating film 15. A Pt film of about 2000 Å is deposited on the substrate by a sputtering method and then the Pt film is patterned by a dry etching using the chloric gas. As a result, the plate electrode 3 composed of the Pt film is formed. In this manner, a capacitor section 4 is formed through the above-mentioned process to have the structure which is composed of the charge storing electrode 2 formed of the Pt/TiN/Ti film on $n^+$ capacitor plug 13, the Pt plate electrode 3 and the PZT film 14 sandwiched between the charge storing electrode 2 and the plate electrode 3, as shown in FIG. 3B.

Next, as shown in FIG. 3C, a $SiO_2$ film is deposited as the third interlayer insulating film 17 on the substrate. Then, there is formed an opening portion 18 (to be referred to as a bit contact hole 18 hereinafter) to reach the NMOSFET diffusion layer of the memory circuit section 7 through the laminated film which is composed of the first interlayer insulating film 12, the second interlayer insulating film 15 and the third interlayer insulating film 17. Also, opening portions 19 (to be referred to as CMOS contact holes 19 hereinafter) are formed to reach the diffusion layers and the gate electrode of the CMOS circuit section through the laminated film which is composed of the first interlayer insulating film 12, the second interlayer insulating film 15 and the third interlayer insulating film 17. At the same time, a plate contact hole (not illustrated) which is the opening to the Pt plate electrode 3 through the third interlayer insulating film 17 is formed.

Finally, as shown in FIG. 3D, aluminium is deposited on the substrate by a sputtering method and the deposited film of aluminum is patterned by a dry etching. Thus, a bit line 6 of the memory circuit section 7 and an aluminum wiring pattern 20 of the CMOS logic circuit section 8 are collectively formed.

The first conventional example of the FRAM device formed from a series of processes mentioned above has the following features:

① the ferroelectric capacitor is formed on $n^+$ capacitor plug 13,

② the bit line 6 of the aluminum wiring film is formed on the ferroelectric capacitor 4, and ③ the bit contact hole 18 and the CMOS contact holes 19 to the $n^+$ diffusion layer and $P^+$ diffusion layer are partially filled with the aluminum wiring film by the sputtering method.

A second conventional example of the FRAM device is proposed by Tanabe et al. in "A Ferroelectric Capacitor over Bit-line (F-COB) Cell for High Density Nonvolatile Ferroelectric Memories" (1995 Symposium on VLSI Technology Digest of Technical Papers, PP. 123–124). FIGS. 4A to 4C are cross sectional views illustrating the manufacturing process of the second conventional example of the FRAM device proposed by Tanabe et al. The method of manufacturing the FRAM will be described.

First, referring to FIG. 4A, a memory circuit section 7 composed of two NMOSFET transfer gates 1 and a CMOS logic circuit section 8 composed of a PMOSFET 9 and an NMOSFET 10 are formed on a silicon substrate 11. The first interlayer insulating film 12 is deposited by a CVD method and the surface of the first interlayer insulating film 12 is flattened by a chemical mechanical polishing (CMP) method. Next, an opening portion (a bit contact hole 18) is formed to reach the $n^+$ diffusion layer of the NMOSFET 1 through the first interlayer insulating film 12. Subsequently, the tungsten silicide ($WSi_x$) film is deposited on the substrate 11 by a sputtering method and then patterned by a reactive dry etching. In this manner, a bit line 6 is formed.

Next, as shown in FIG. 4B, the second interlayer insulating film 15 is deposited on the substrate 11 by a CVD method and then flattened by the chemical mechanical polishing (CMP) method. Thereafter, a Pt/Ti film is deposited for the lower electrode of the capacitor section 41 by a sputtering method and further a PZT film 14 is grown by a sol/gel method. The PZT film 14 is subjected to annealing at the temperature of 600° C. in an oxygen gas to be crystalized. Then, the PZT film 14 and the Pt/Ti film 41 are patterned. Next, a Pt film is deposited by a sputtering method and the upper capacitor electrode 43 is formed on PZT film 14 by dry etching the Pt film using a chloric system gas. In the second conventional example of the FRAM device, the lower electrode 41 of Pt/Ti is the plate electrode 3 and the upper electrode 43 is the charge storing electrode 2. After the third interlayer insulating film 17 is formed, opening portions (to be referred to as local wiring contact holes 61 hereinafter) are formed to reach the diffusion layers of the NMOSFET transfer gates 1 of the memory circuit section 7 through the first to third interlayer insulating films 12, 15 and 17, and to reach the upper electrode 43 through the third interlayer insulating film 17. Also, opening portions (to be referred to as CMOS contact holes 19) are formed to reach the $n^+$ diffusion layer and gate electrode of the NMOSFET 10, and the $P^+$ diffusion layers of the PMOSFET 9 in the CMOS circuit section 8 through the first to third interlayer insulating films 12, 15 and 17.

Finally, as shown in FIG. 4C, after a TiN/Ti barrier film (not illustrated) is deposited by a sputtering method, a TiN film (not illustrated) and an aluminum film are deposited by an MOCVD method. Subsequently, the Al/TiN/Ti laminate film is patterned by a reactive dry etching. As a result, an aluminium local wiring pattern 21 which connects the diffusion layer of the NMOSFET transfer gates 1 in the memory circuit section and the Pt upper capacitor electrode 43 (the charge storing electrode 2) and an aluminum wiring pattern 20 which connects between CMOS circuits are formed.

The second conventional example of the FRAM device formed through a series of above-mentioned processes has the following features:

① the ferroelectric capacitor 4 is formed on the bit line 6,

② the $n^+$ diffusion layers of the NMOSFET transfer gates 1 and the upper capacitor electrode 43 (the charge storing electrode 2) are connected by the local wiring pattern 21, and ③ the opening portions (the local wiring contact hole 61 and the CMOS contact holes 19) penetrating the first to third interlayer insulating films 12, 15 and 17 are partially filled with the aluminum film by the MOCVD method after the ferroelectric capacitor section 4 is formed.

The third conventional example of the DRAM device is proposed by Kang et al. in "Highly Manufacturable process Technology for Reliable 256 Mbit and 1 Gbit DRAMs" (1994 IEDM, Technical digest, pp. 635–638, 1994). In the third conventional example of the DRAM device fabrication process, which is applicable to an FRAM device fabrication process, a tungsten film is grown by a CVD method before a capacitor section is formed and the tungsten film is used for a bit line. The method of manufacturing the third conventional example of the DRAM device will be described. FIGS. 5A to 5D are cross sectional views illustrating the manufacturing process of the DRAM device proposed by Kang et al.

First, as shown in FIG. 5A, NMOSFET transfer gates 1 of the memory circuit section 7 and a PMOSFET 9 and an NMOSFET 10 of the CMOS circuit section 8 are formed on a silicon substrate 11. Side wall insulating films are formed on the sides of gate electrodes 22 of the MOSFETs. After an interlayer insulating film is deposited, opening portions are formed to reach the $n^+$ diffusion layers of the NMOS transfer gates 1 of the memory circuit section. By performing a CVD method and an etching back method, $n^+$ polysilicon plugs 23 are formed at the opening portions. Further, after a first interlayer insulating film 12 is deposited on the substrate 11 by a CVD method, the surface of the first interlayer insulating film 12 is flattened by a CMP method. Thereafter, an opening portion (bit contact hole) 18 is formed to reach the $n^+$ polysilicon plug 23 through the first interlayer insulating film 12. Next, a Ti film (not illustrated) is deposited on the substrate 11 by a sputtering method. A lamp annealing is performed to the Ti film to react Ti with polysilicon such that a titanium silicide film is formed on the $n^+$ contact plug 23 (not illustrated). Next, after a TiN barrier film (not illustrated) is deposited on the substrate 11 by a reactive sputtering method, a tungsten film 24 is deposited on the TiN film by a CVD method. The laminate film is patterned by a reactive ion etching using a photo-resist pattern as a mask.

As a result, a tungsten bit line 24 is obtained. However, at this time, a tungsten contact plug is not formed to reach the CMOS circuit section.

Next, as shown in FIG. 5B, a second interlayer insulating film 15 is deposited on the substrate 11 and opening portions (capacitor contact holes 25) are formed to reach the $n^+$ polysilicon plugs 23 through the second interlayer insulating film 15. Thereafter, cylindrical charge storing electrodes 25 of the $n^+$ polysilicon are formed on the capacitor contact plugs 23. Then, a film of $Ta_2O_3$ as a high permitivity substance is deposited and etched such that the $Ta_2O_3$ 26 are formed on the surface of the cylindrical charge storing electrode 25. Next, after a TiN barrier film is deposited by a sputtering method and patterned, an $n^+$ polysilicon plate electrode 3 is formed by a CVD method. Through a series of processes mentioned above, a capacitor section is formed to have the $Ta_2O_3$ film 26 as the capacitive film on the storing electrodes 25.

Next, as shown in FIG. 5C, a third interlayer insulating film 17 is deposited by a CVD method, an opening portion (a plate contact holes 27) is formed to reach the $n^+$ polysilicon plate electrode 3 through the third interlayer insulating film 17. Also, opening portions (CMOS contact holes 19) are formed to reach the diffusion layers of the CMOS circuit section 8 through the first to third interlayer insulating films 12, 15 and 17 and to reach the tungsten bit line film 24 through the second and third interlayer insulating films 15 and 17.

Finally, as shown in FIG. 5D, after a TiN/Ti barrier film (not illustrated) is deposited by a collimator sputtering method, an Al film is deposited on the surface by a high temperature sputtering method and the formed Al film is patterned. In this manner, the CMOS contact holes 19, the plate contact hole 27 and the bit line contact are collectively filled with aluminum. Lastly, a reactive etching is performed to the Al/TiN/Ti film such that an aluminum wiring pattern 20 is formed.

However, there are the following problems in the structure and manufacturing method of the conventional FRAM devices.

First, in the first conventional example of the FRAM device proposed by Onishi et al., the bit line 6 is formed on the ferroelectric capacitor 4. Therefore, the bit contact hole 18 is very deep to reach the transfer gate 1 through the first to third interlayer insulating films 12, 15 and 17. It is difficult for such a deep bit contact hole 18 to be filled with the aluminum film by the sputtering method. It would be possible to expand the diameter of the bit contact hole 18 such that it can be filled with the aluminium film easier. As a result, however, the size of the memory capacitor cell increases in area, so that the high density integration cannot be achieved. Further, because electrostatic coupling is formed between the aluminum film filling the bit contact and the ferroelectric capacitor 4, the capacity of the bit line 6 increases such that the bit line drive ability is decreased.

In the second conventional example of the FRAM device proposed by Tanabe et al., the capacitor on bit-line (COB) structure is used in which the ferroelectric capacitor 4 is formed on the bit line 6 to reduce the bit line capacity. However, for the use of the COB structure, the local wiring contact hole 61 to the NMOS transfer gates 1 and the CMOS contact holes 19 to the diffusion layers of the PMOSFET 9 and the NMOSFET 10 of the CMOS circuit section 8 becomes further deeper by the thickness of the bit line 6 at least. As a result, it becomes further difficult to fill the local wiring contact holes 61 and the CMOS contact holes 19 with the aluminum film only by the sputtering method. Therefore, it is necessarily required to grow the aluminium film by an MOCVD method such that the contacts is filled with the Al film.

By the way, if composite metal oxide such as PZT is exposed to the reducing ambient of hydrogen and so on, oxygen atoms are quitted so that oxygen defects are caused in the crystal. The oxygen defects causes the decrease of a remaining polarization value and the increase of leakage current, resulting in degradation of the ferroelectric characteristic of the capacitor section. In the growth of the Al film by the MOCVD method, a hydrogen gas is generally used as a carrier gas. For this reason, it is not preferred that the Al film is grown by the MOCVD method after the ferroelectric capacitor section is formed. In this manner, because the metal CVD process can not be used after the ferroelectric capacitor section is formed, direct application of the method of manufacturing a DRAM device to the FRAM device process would be limited.

In the third conventional example of the FRAM device proposed by Kang et al., the method of Kang et al. corresponds to the DRAM device manufacturing process and the tungsten bit line 24 is formed using the CVD method before the $Ta_2O_3$ film capacitor section is formed. However, it is not tried that when the tungsten bit line is formed, the opening portions (the CMOS contact holes 19) to reach the diffusion layers to the CMOS circuit section 8 are filled with tungsten which is heat-resistant material such that the heat-resistant metal contact plugs are formed at the same time of the formation of the tungsten bit line.

It could be considered that the Kang's method can be applied to the FRAM device manufacturing process by replacing the film of $Ta_2O_3$ as a high dielectric material with the ferroelectric film such as the PZT film. However, the opening portions (the CMOS contact holes 19) are very deep to reach the diffusion layers of the CMOS logic circuit section through the first to third interlayer insulating films 12, 15 and 17. In order to deposit the aluminum film using the reflow sputtering method for filling such deep opening portions 19, a high temperature of equal to or higher than 450° C. is required. The ferroelectric film is damaged because of the heat during this sputtering method or the heat stress, resulting in increase of leak current and the decrease of a remaining polarization value. That is, it is impossible to directly apply the method of forming the DRAM device by Kang et al. to the method of forming the FRAM device.

The above mentioned problems relates to the formation of the wiring pattern in the FRAM device. There is remained another problem in the method of forming the ferroelectric capacitor section. In a case that PZT is used as the material of the ferroelectric thin film, the annealing for crystallization of the PZT film after the deposition of the PZT film needs to be performed in the oxygen ambient. Therefore, it is required that the lower capacitor electrode which is provided under the PZT thin film has resistance to oxidation. For this reason, Pt is generally used for the lower capacitor electrode. However, both of PZT and Pt are materials difficult to perform dry etching.

In addition, as shown in FIG. 6A, when the laminate film 29 composed of the PZT film 14 and the Pt lower capacitor electrode film 41 is patterned using a photo-resist pattern 28 as a mask, side wall deposition films 30 mainly composed of the PZT film and the Pt film is deposited on the side walls of the photoresist 28. When the photoresist 28 is removed by an oxygen plasma ashing process, the side wall deposition films 31 like the rabbit's ears are left on the PZT/Pt film pattern, as shown in FIG. 6B. The rabit ear-like side wall deposition films 31 are removed by a mechanical process in which a rotating brush 32 is used. In this case, the PZT film surface 33 is rubbed by the rotating brush 32, so that fine flaws and crystal defects are caused which are one of reasons of degradation of the ferroelectric characteristics of the PZT film.

As described above, the conventional methods of manufacturing the FRAM device is suffering from filling the deep contact holes extending to the diffusion layers with wiring metal without damaging the ferroelectric capacitor section. Accordingly, it is difficult to ensure the reliability of the wiring. Further, in a case where the rabit ear-like side wall deposition films are removed which are formed when the ferroelectric film formed on the lower electrode film of Pt and so on is patterned, a damage is given the surface layer of the ferroelectric film. The characteristic of the FRAM device are degraded even because of these two problems.

SUMMARY OF THE INVENTION

Therefore, an object of the present invention is to provide a semiconductor device such as a ferroelectric random access memory (FRAM) device in which contact holes to diffusion layers of a memory circuit section and a CMOS logic circuit section are not necessary to have a large aspect ratio and a manufacturing method for the same.

Another object of the present invention is to provide an FRAM device in which electric conductivity to diffusion layers of a memory circuit section and a CMOS logic circuit section can be established without giving a dielectric film such as a ferroelectric thin film any damage by the manufacturing method.

Still another object of the present invention is to provide a method of manufacturing a semiconductor device such as an FRAM device which method can remove side wall deposition films formed in a case that a capacitive thin film is patterned, without damaging the capacitive thin film surface.

In order to achieve an aspect of the present invention, a semiconductor device includes a CMOS section formed on a substrate and including an N-channel MOS transistor and a P-channel MOS transistor, a memory section formed on the substrate and including at least a transfer gate MOS transistor, a first insulating film formed on the substrate including the CMOS circuit section and the memory circuit section, a bit line wiring pattern interposed in the first insulating film and connected to the transfer gate MOS transistor via a bit line contact, a plurality of conductive plugs provided to penetrate the first insulating film to the MOS transistors, a capacitor section formed on the first insulating film and composed of an upper electrode, a dielectric film and a lower electrode, a second insulating film formed on the first insulating film including the capacitor section, and a wiring pattern formed on the second insulating film and provided to penetrate the second insulating film and to be connected to the plurality of conductive plugs.

In this case, the plurality of conductive plugs is composed of a heat resistant metal film and each of the plurality of conductive plugs is composed of a barrier film composed of a titanium silicide layer and a titanium nitride layer, and a tungsten film.

The dielectric film is formed of at least one of PZT, (Sr, Ba)TiO$_3$, SrBi$_2$Ta$_2$O$_9$ and Bi$_4$Ti$_3$O$_{12}$.

One of the plurality of plugs is connected to the transfer gate MOS transistor through the second insulating film and a part of the wiring pattern is connected to the one plug connected to the transfer gate MOS transistor and to the upper electrode of the capacitor section through the second insulating film. Alternatively, the capacitor section may be provided on one of the plurality of conductive plugs connected to the transfer gate MOS transistor such that the lower electrode is connected to the one plug connected to the transfer gate MOS transistor, and a part of the wiring pattern may be connected to the upper electrode of the capacitor section through the second insulating film.

When the first insulating film is composed of a first insulating sub-film and a second insulating sub-film, each of the plurality of conductive plugs is composed of a first plug portion provided to penetrate the first insulating sub-film and a second plug portion provided to penetrate the second insulating sub-film, the first and second plug portions being composed of a heat resistant film.

In order to achieve another aspect of the present invention, a semiconductor device includes a CMOS section formed on a substrate and including an N-channel MOS transistor and a P-channel MOS transistor, a memory section formed on the substrate and including at least a transfer gate MOS transistor, a first insulating film formed on the substrate including the CMOS circuit section and the memory circuit section, a plurality of conductive plugs provided to penetrate the first insulating film to the MOS transistors, an interlayer wiring pattern interposed in the first insulating film, and connected between at least two of said plurality of conductive plugs wherein a part of the interlayer wiring pattern is connected to the transfer gate MOS transistor via a bit line contact and connects at least two of the plurality of conductive plugs, a capacitor section formed on the first insulating film and composed of an upper electrode, a dielectric film and a lower electrode, a second insulating film formed on the first insulating film including the capacitor section, and a wiring pattern formed on the second insulating film and provided to penetrate the second insulating film and to be connected to the plurality of conductive plugs.

In order to achieve still another aspect of the present invention, a method of manufacturing a semiconductor device includes the steps of:

forming on a substrate a CMOS section composed of an N-channel MOS transistor and a P-channel MOS transistor and a memory section composed of at least a transfer gate MOS transistor;

forming a plurality of conductive plugs to penetrate a laminate insulating film to the MOS transistors, the laminate insulating film being composed of a first insulating film and a second insulating film;

forming a capacitor section on the laminate insulating film, the capacitor section being composed of an upper electrode, a dielectric film and a lower electrode;

forming a third insulating film on the laminate insulating film and the capacitor section; and forming a wiring pattern on the third insulating film to partially penetrate the second insulating film to the plurality of conductive plugs.

In this case, a plurality of conductive plugs are formed by forming the first insulating film on the substrate, the CMOS section and the memory section, forming the second insulating film on the first insulating film, forming contact holes to penetrate the first and second insulating films to the MOS transistors, and filling the contact holes with at least one conductive material. Alternatively, the plurality of conductive plugs may be formed by forming the first insulating film on the substrate, the CMOS section and the memory section, forming first contact holes to penetrate the first insulating films to the MOS transistors, filling the first contact holes with at least one conductive material to form first contacts, forming the second insulating film on the first insulating film, forming second contact holes to penetrate the second insulating films to the first contacts, and filling the second contact holes with at least one conductive material.

The method may further includes the steps of:
forming the first insulating film on the substrate, the CMOS section and the memory section;
forming a bit line wiring pattern on the first insulating film to penetrate the first insulating film to the transfer gate MOS transistor; and
forming the second insulating film on the first insulating film to complete the laminate insulating film. In addition, the method may further include the steps of:
forming the first insulating film on the substrate, the CMOS section and the memory section;
etching the first insulating film to form a trench pattern and to form first contact holes to the MOS transistors, a part of the first contact holes being connected to the trench pattern;
filling the trench pattern and first contact holes with a film composed of conductive heat resistant material;
forming the second insulating film on the first insulating film;
forming second contact holes to penetrate the second insulating films to remaining ones of the first contacts which are not connected to the trench pattern; and
filling the second contact holes with a film composed of conductive heat resistant material to complete the plurality of conductive plugs.

In this case, a part of the trench pattern which is filled which the film composed of conductive heat resistant material of at least one conductive material is a bit line connected to the transfer gate MOS transistor. The capacitor section is formed on the laminate insulating film such that the lower electrode is positioned on and connected to one of the plurality of conductive plugs.

In order to form the capacitor section, the lower lectrode is formed by depositing first and second metal films on the laminate insulating film, and forming an oxidation resistant layer from the first metal film and crystallizing the second metal film.

Further, in order to form the capacitor section, a lower electrode conductive film is formed on the laminate insulating film, a dielectric film is formed on the lower electrode conductive film. Subsequently, after a protective conductive film is formed on the dielectric film, the lower electrode conductive film, the dielectric film and protective film are patterned for the lower electrode and the dielectric film. Then, an upper electrode conductive film is formed and the upper electrode film is patterned to form the upper electrode. In this case, a hydrogen diffusion preventing conductive film is deposited on the upper electrode film, and the hydrogen diffusion preventing conductive film is patterned at the same time as patterning the upper electrode film.

DESCRIPTION OF THE PREFERRED EMBODIMENTS

A semiconductor device of the present invention such as a non-volatile memory device which uses a film of ferroelectric material as a capacitive film, i.e., a FRAM device of the present invention will be described below in detail with reference to the accompanying drawings.

The FRAM device according to the first embodiment of the present invention will be first described below. In the first embodiment, a ferroelectric capacitor section is formed on a bit line in a memory circuit section to have a lower electrode as a plate line and an upper electrode 43 as a charge storing electrode. The upper electrode is connected to a diffusion layer of an NMOSFET transfer gate through an aluminum local wiring 21 and a heat resistant metal conductive plug which is filled with a tungsten film. Also, the upper electrode is connected to a diffusion layer of a CMOS circuit section through an aluminum wiring pattern 20 and a heat resistant metal plug.

FIGS. 7A to 7G are cross sectional views illustrating the manufacturing process of the FRAM device according to the first embodiment of the present invention.

Figure 1:
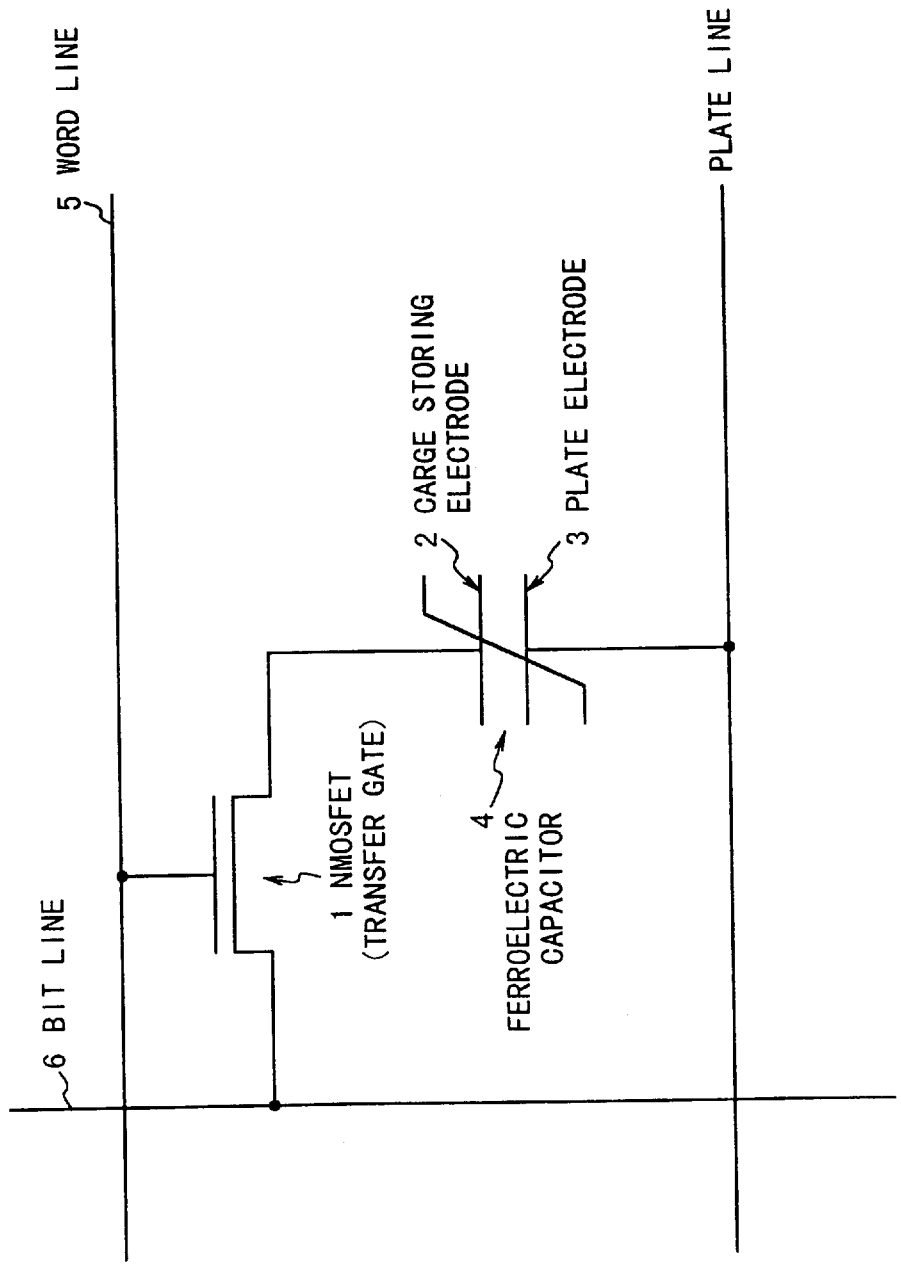
FIG. 1 is a circuit diagram illustrating the circuit structure of a memory capacitor cell of a conventional non-volatile ferroelectric random access memory (FRAM) device.
Figure 2:
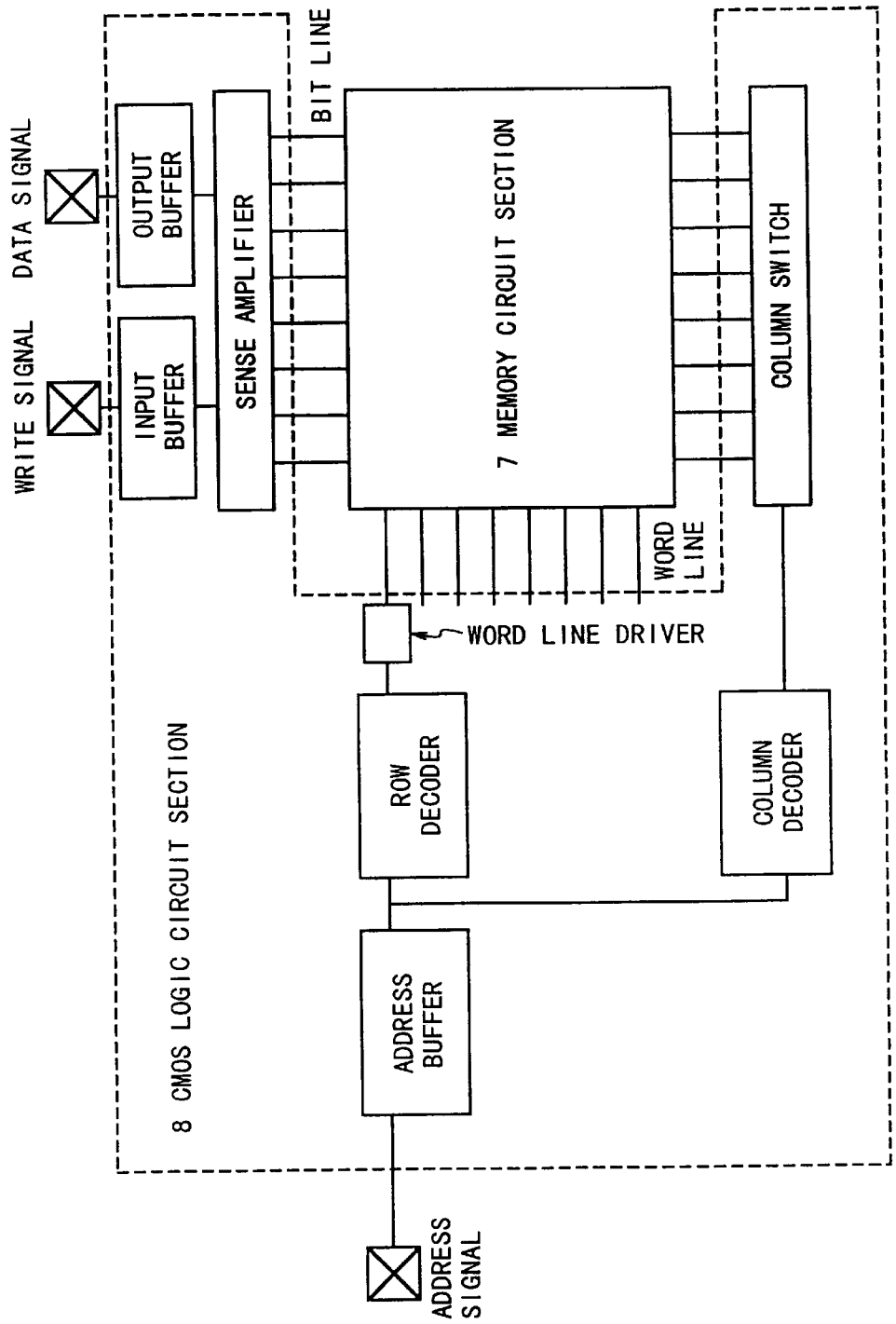
FIG. 2 is the circuit block diagram of the conventional FRAM device partially illustrated in FIG. 1.
Figure 3A:
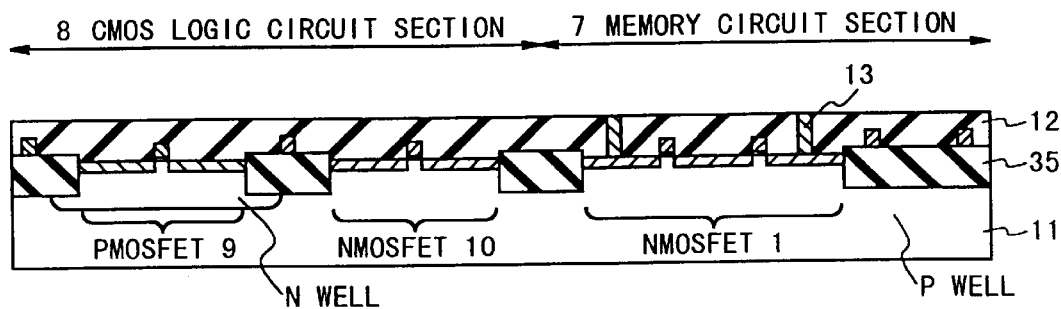
FIGS. 3A to 3D are cross sectional views illustrating a manufacturing process to explain the method of manufacturing a first conventional example of the FRAM device.
Figure 3B:
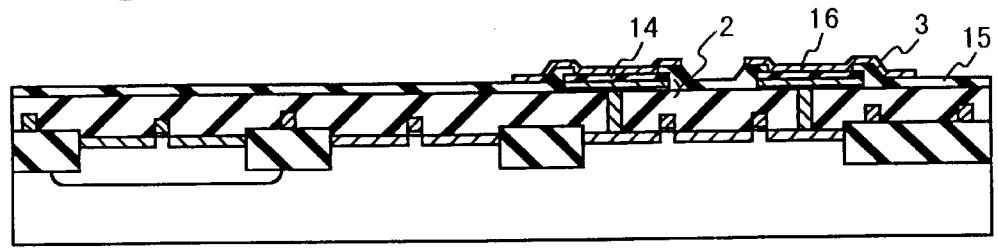
Figure 3C:
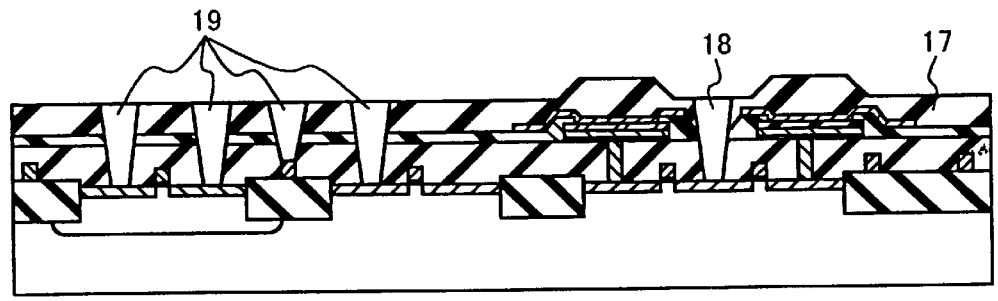
Figure 3D:
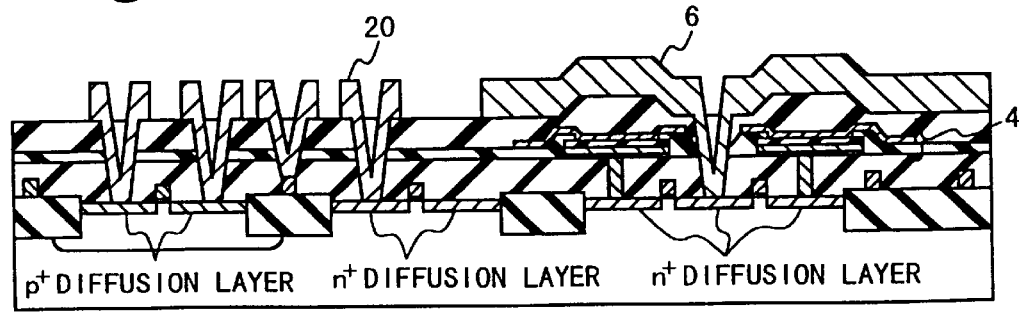
Figure 4A:
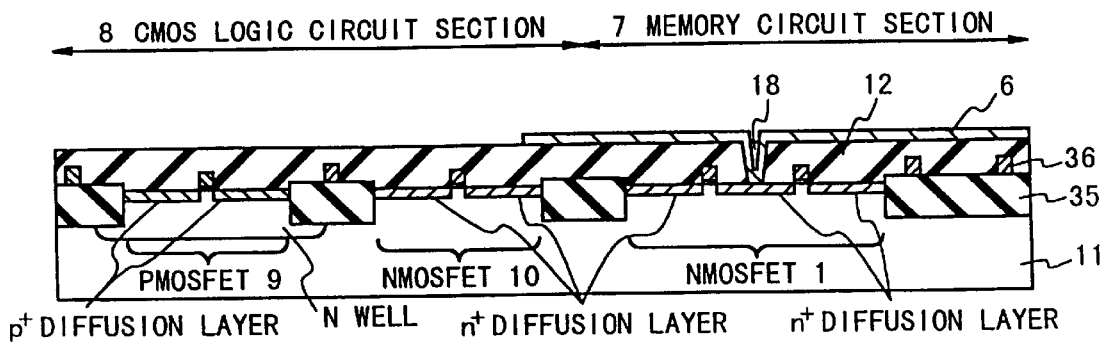
FIGS. 4A to 4C are cross sectional views illustrating a manufacturing process to explain the method of manufacturing a second conventional example of the FRAM device.
Figure 4B:
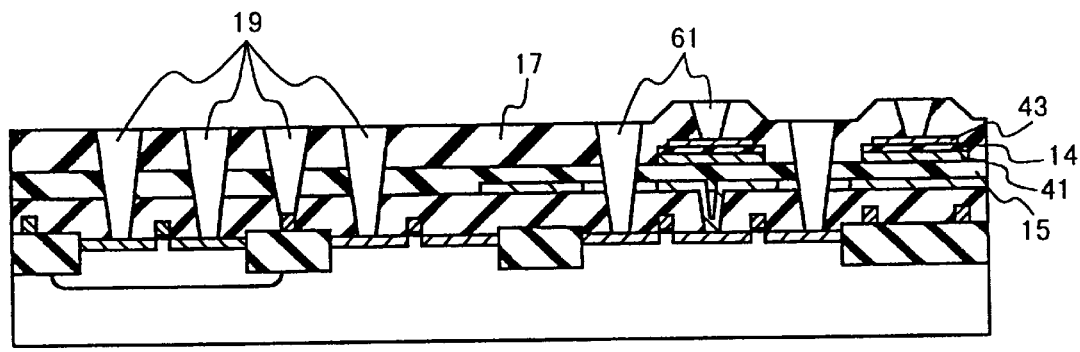
Figure 4C:
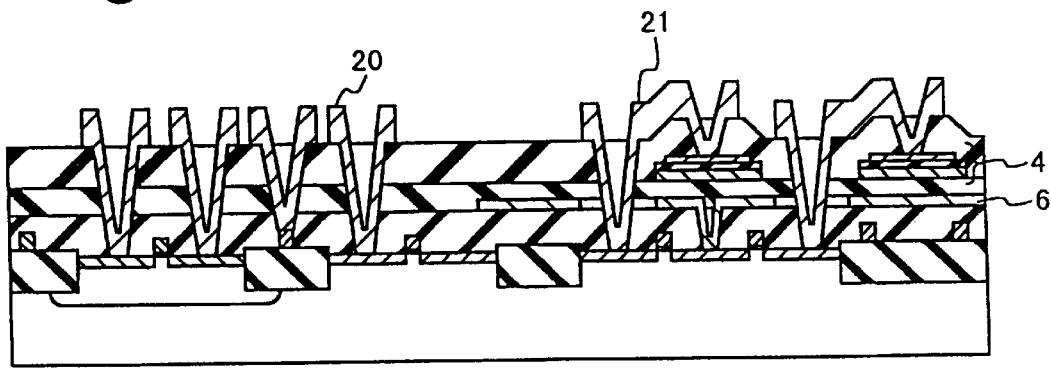
Figure 5A:
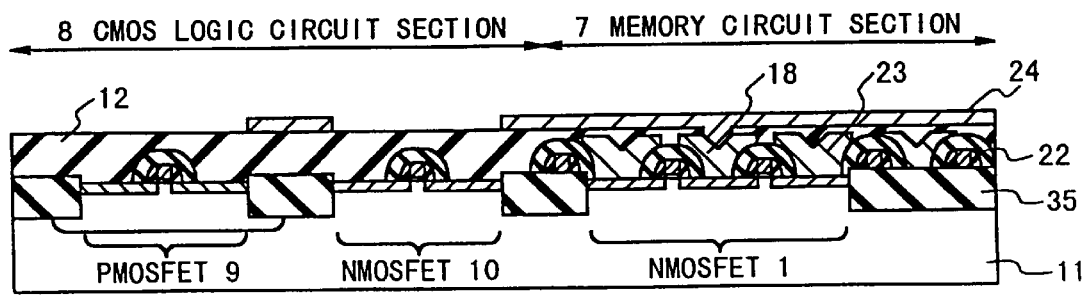
FIGS. 5A to 5D are cross sectional views illustrating a manufacturing process to explain the method of manufacturing a third conventional example of the FRAM device.
Figure 5B:
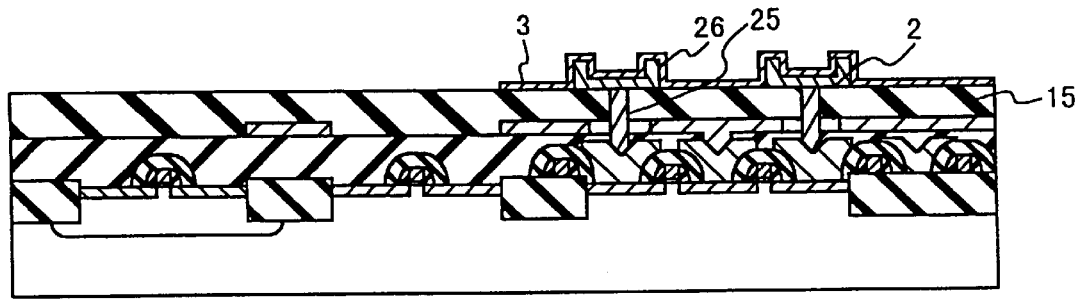
Figure 5C:
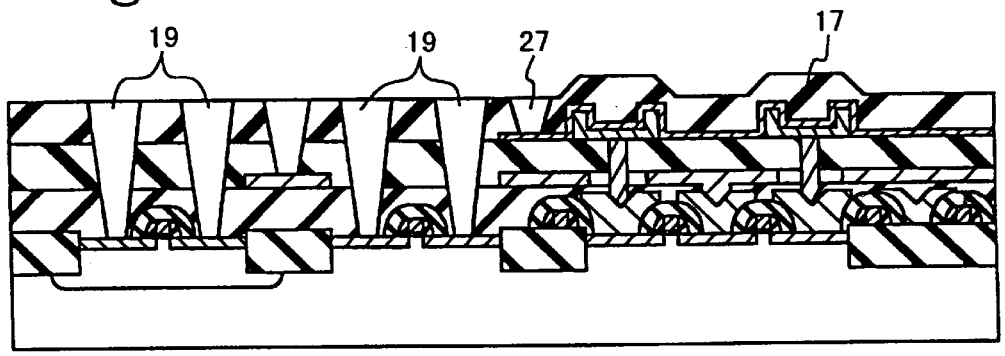
Figure 5D:
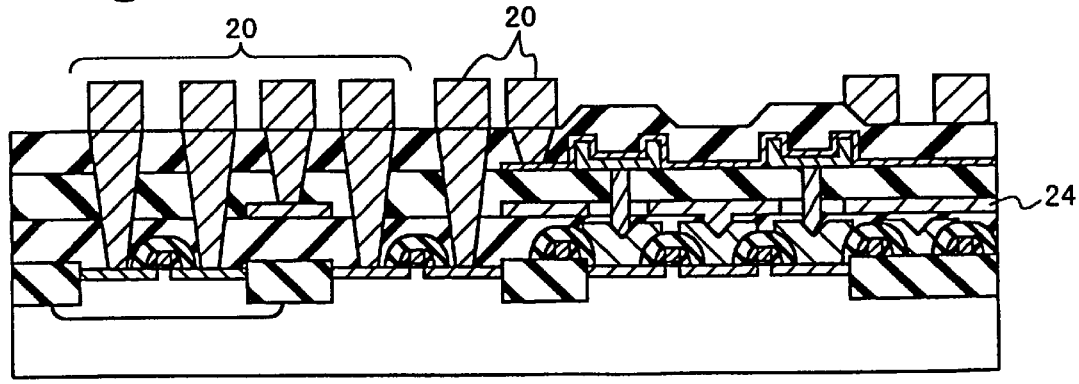
Figure 6A:
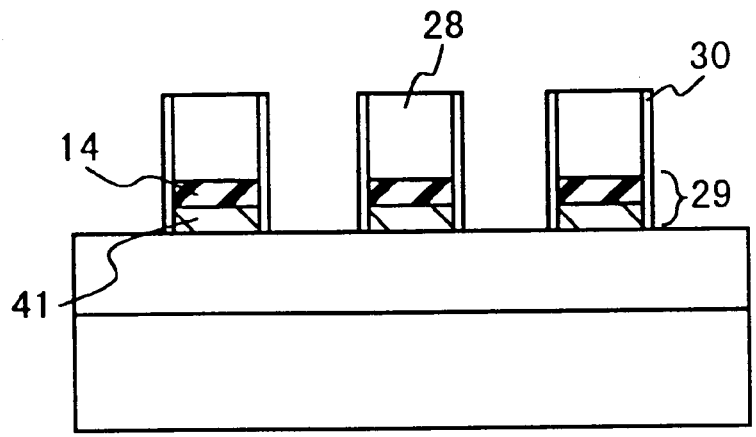
FIGS. 6A and 6B are cross sectional views to explain a patterning process of the lower electrode and the ferroelectric film formed on the lower electrode in the conventional manufacturing method of the FRAM device.
Figure 6B:
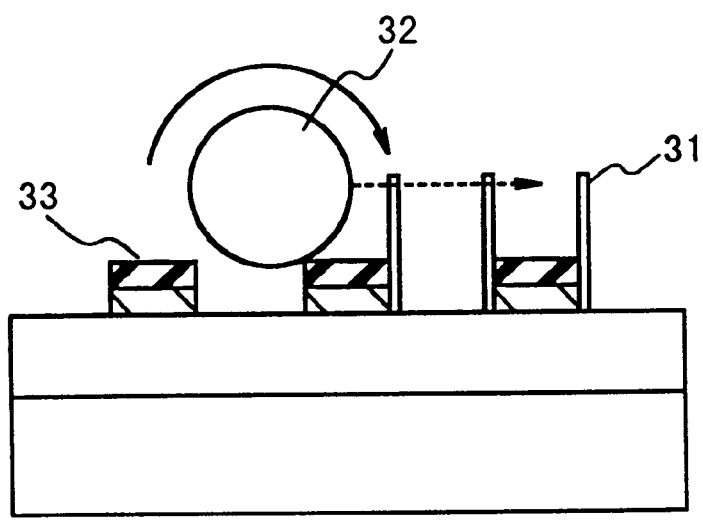
Figure 7A:
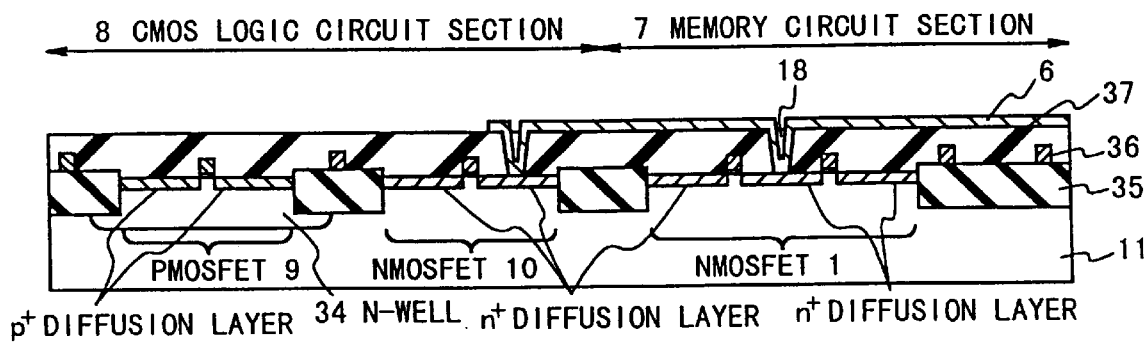
FIGS. 7A to 7G are cross sectional views to explain the method of manufacturing the FRAM device according to a first embodiment of the present invention.

First, referring to FIG. 7A, an N-type well 34 is formed in a PMOSFET forming region 9 of a CMOS logic circuit section 8 of a P-type silicon substrate 11 by ion implantation of phosphor and forced oxidation. After element separation oxidation films 35 of 6000 Å are formed by a heat oxidation process using a nitride film mask, a P-type layer (a guard ring boron layer: not illustrated) is formed at the bottom of one of the element separation oxidation films 35 which separates NMOSFET transfer gates 1 of the memory circuit section 7 and an NMOSFET 10 of the CMOS logic circuit section 8. After the arsenic ions are implanted in a depletion-type NMOSFET (not illustrated) forming region, boron ions are implanted to control the threshold value of the NMOSFETs so that a p⁻ surface layer (not illustrated) is formed in NMOSFET 1 and 10 forming regions at the surface of the silicon substrate 11. Also, boron ions are counter-doped in the PMOSFET 9 forming region in the N-type well 34 to form an N⁻-type region (not illustrated) in the surface portion of the substrate 11.

Next, after a gate oxide film having the thickness of about 100 Å to 200 Å is grown by an $O_2$-annealing method, a polysilicon film having the thickness of about 3000 Å is deposited by a CVD method. Diffusion of phosphor ions is performed to the polysilicon film such that the polysilicon film has the sheet resistance of 100 $\Omega/\square$ to 200 $\Omega/\square$ and then polysilicon gate electrodes 36 are formed by a dry etching method. In the memory circuit section, the polysilicon gate electrode 36 is used as a word line 5. Subsequently, the side wall films (not illustrated) are formed around each of the gate electrodes 3. Next, arsenic ions are implanted in the NMOSFET 1 and 10 forming regions to form $n^+$ diffusion layers and $BF_2$ is ion-implanted in the PMOSFET forming region to form $P^+$ diffusion layers.

Next, after a silicon oxide film (not illustrated) is deposited by a CVD method to have the thickness of about 2000 Å, a boron and phosphor adding silica glass (a first BPSG film) 37 is deposited as a first interlayer insulating film. Then, the semiconductor substrate is heated to 850° C. such that the BPSG film is reflowed. Thereafter, the surface of the BPSG film 37 is flattened by a chemical mechanical polishing (CMP) method. In the CMP method, a neutral polishing solution is used in which colloidal silica particles having the particle size of about 100 Å is dispersed in an ammonium salt adding solution. The neutral polishing solution is dropped on a polishing pad that is being rotated at 35 rpm. The substrate 11 is made to contact the polishing pad while being held to a rotating head. When the polishing pressure is about 0.4 kg/cm$^2$, the polishing rate of the silicon oxide film is 1000 to 2000 Å/min. An opening portion (to be referred to as a bit contact hole 18 hereinafter) is formed to penetrate the first BPSG film 37 to a common one of the diffusion layers of the NMOSFET transfer gates 1 and a tungsten silicide (WSi$_x$) film of 2000 Å is deposited by a sputtering method. Subsequently, after phosphor ions are implanted to form an $n^+$ region (not illustrated) in the bottom portion of the bit contact hole 18, a bit line 6 of the tungsten silicide film is formed by a dry etching.

Figure 7B:
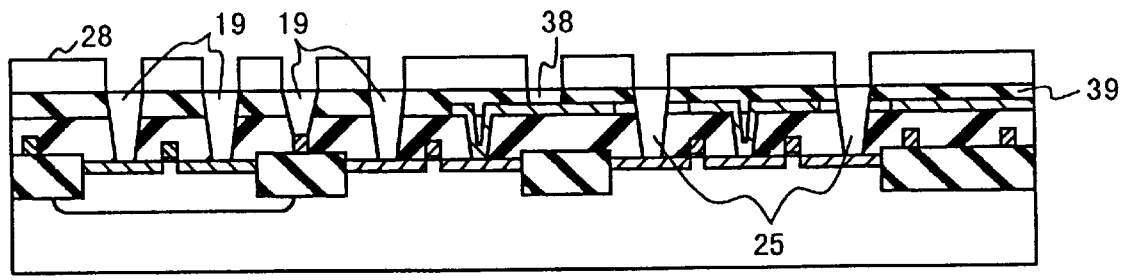

Next, as shown in FIG. 7B, a second BPSG film 39 is deposited and the surface of the second BPSG film 39 is flattened by reflowing and the CMP method. Thereafter, using a photo-resist 28 as a mask, opening portions (to be referred to as capacitor contact holes 25 hereinafter) are formed to penetrate the first and second BPSG films 37 and 39 to separate ones of the diffusion layers of the NMOSFET transfer gates 1 in memory circuit section 7. Also, an opening portion (to be referred to as a bit line via-hole 38 hereinafter) is formed to penetrate the second BPSG film 39 to the bit line. In addition, opening portions (to be referred to as CMOS contact holes 19 hereinafter) are formed to penetrate the first and second BPSG films 37 and 39 to the $P^+$ diffusion layers and $n^+$ diffusion layers of the CMOS circuit section 8 and a pattern formed on the element separation insulating film 35 which pattern may be connected to the gate. Thereafter, the ion implantation of phosphor ions may performed to form the $n^+$ layer at the bottom of the opening portion to the NMOSFET diffusion layers, if necessary. Also, ion implantation of boron ions may be performed at the bottom of the opening portion to the PMOSFET diffusion layers to form the $P^+$ layer.

Figure 7C:
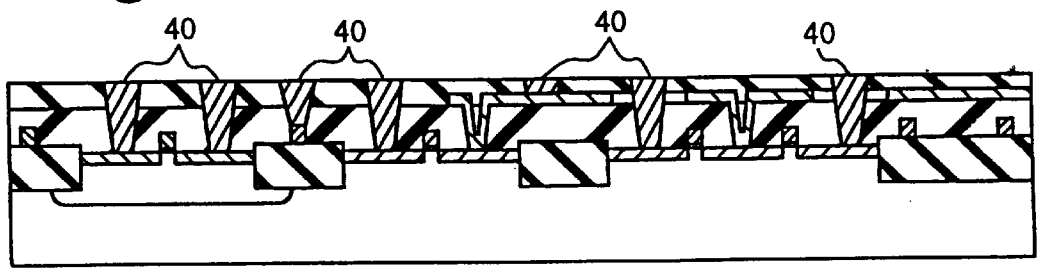

Next, as shown in FIG. 7C, the capacitor contact holes 25, the bit line via-hole 38, and the CMOS contact holes 19 are filled with tungsten as heat-resistant metal to complete heat-resistant metal plugs 40. For this purpose, a barrier film (not illustrated) which is composed of a Ti film of 500 Å and a TiN film of 500 Å is first deposited by a collimator sputtering method and then the barrier film is heated by a lamp annealing method in a nitrogen ambient. Note that it is important that silicide forming reaction is caused to occur at the interface between the diffusion layer and the barrier layer so that a TiSi$_x$/TiN (not illustrated) is formed. The heating condition is, for example, 600° C. for 30 sec. However, two steps of annealing of 600° C. for 30 sec. and 700° C. for 30 sec. may be employed as the heating condition, if necessary.

Next, a tungsten film (not illustrated) is deposited to the surface of the second BPSG film 39 by a blanket CVD method. It is suitable that the film thickness of the deposited tungsten film is about 1.5 times the radius of the opening portions 19 and 38. Thereafter, the tungsten film on second BPSG film 39 is removed by a selective tungsten CMP method using the polishing solution in which alumina fine particles of about 500 to 2000 Å are dispersed in an acid solution of about 3 pH which contains the hydrogen peroxide or Fe(NO$_3$)$_3$. It is suitable that the polishing pressure is 0.2 to 0.4 kg/cm$^2$, a rotation speed of a head holding the substrate and a polishing table is about 35 to 50 rpm. Alternatively, as the polishing solution, the solution may be used in which silica particles of 100 to 500 Å are dispersed in a dilute ammonia solution of about 9 pH which contains oxidation agent, e.g., hydrogen peroxide and an ammonium salt, e.g., ammonium nitrate or acetic ammonium (CH$_3$COONH$_4$). After the CMP method, a scrubbing method is performed to remove the polishing particles. As a result, the heat-resistant metal plugs can be obtained in which the opening portions 19, 25 and 38 are filled with the tungsten film.

Figure 7D:
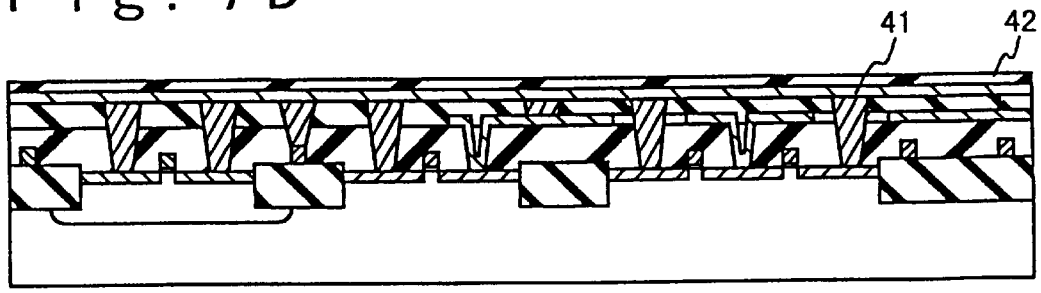

Next, as shown in FIG. 7D, a Ti film of 100 Å in thick and a Pt film of 2000 Å in thick are deposited by a sputtering method for formation of the lower capacitor electrode 41 as the plate electrode 3. Then, the annealing is performed at a temperature of 400 to 500° C. in a nitrogen ambient. As a result, the Pt film is crystallized. At the same time, an oxidation resistant layer (not illustrated) of TiW is formed in the interface between the Ti film for the lower capacitor electrode 41 and W of the heat-resistant metal plug 40. At this time, the Ti film of the Ti/Pt film 41 on the second BPSG film 39 is nitrided to form a TiN layer. Therefore, the lower capacitor electrode 41 is formed as the TiN/Pt film through the above process.

Next, a ferroelectric film 42 is deposited. As a method of depositing the ferroelectric film, there is a sol/gel method, a sputtering method or a CVD method. For instance, in a case where zircon lead titanate film is deposited by the sol/gel method, composite alkoxide solution in which is composed of zirconia alkoxide, titanium alkoxide and lead acetate is dissolved in an organic solvent such as methoxyethanol is spin-coated on the lower electrode film 41. After the organic solvent is evaporated and removed, annealing for crystallization is performed at 600° C. for about 10 min. in an oxygen ambient. In the case of the spin coating, the coated film thickness is about 1000 Å per once coating, the process composed of the spin coating, the removal of the organic solvent, and the crystallization annealing is repeated twice, if the PZT film of, for example, 2000 Å is required. It is necessary that lead (Pb) in the composite alkoxide solution is more than stoichiometric composition by about 10 to 20 mol %. This is because if a part of Pb is evaporated during the crystallization annealings, the lack of Pb occurs in the PZT film. Note that it is possible for PZT to be crystallized by the lamp annealing in 550 to 650° C. for 30 sec. in an oxygen ambient.

Figure 7E:
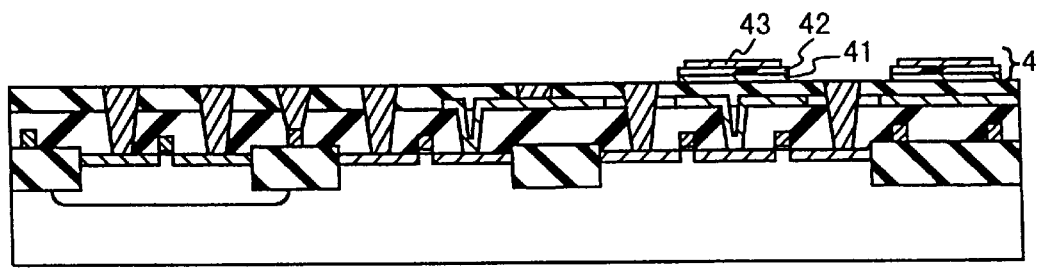

Next, as shown in FIG. 7E, the ferroelectric capacitor section 4 is formed which is composed of the PZT film 42 sandwiched by the lower capacitor electrode 41 of Pt and the upper capacitor electrode 43. The process of forming the ferroelectric capacitor section 4 is shown in detail in FIGS. 8A to 8F.

Figure 8A:
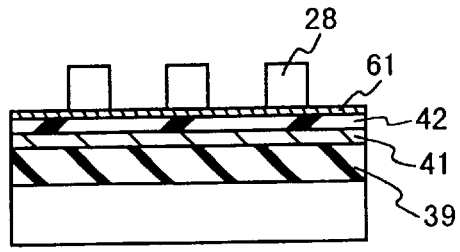
FIGS. 8A to 8F are cross sectional views to explain a scrubbing process in the method of manufacturing the FRAM device according to the first embodiment of the present invention.
Figure 8B:
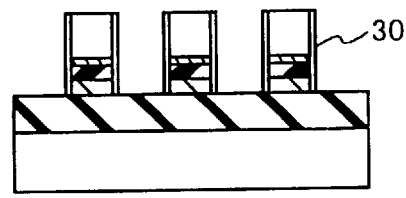
Figure 8C:
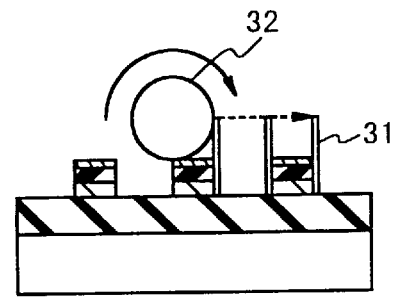

First, as shown in FIG. 8A, a Pt noble metal protecting film 61 is deposited on the PZT film 42 to have the thickness of about 500 Å. Thereafter, as shown in FIG. 8B, the noble metal protecting film 61, the PZT film 42 and the lower capacitor electrode film 41 are collectively patterned by an Ar ion milling method using a photo-resist mask 28. At this time, side wall deposition film 30 which contains Pt as a main component is formed on each of the side walls of the photo-resist mask 28. When the resist mask 28 is removed by an oxygen plasma peeling method, the side wall deposition films 31 are remained in a rabbit's ears manner. This ear-like side wall deposition films 31 are removed by the scrubbing method using a rotating brush 32. In this case, however, because the above-mentioned noble metal protecting film 61 is formed on the PZT film 42 surface, the rotating brush never directly touches the surface of the PZT film 42 during the scrubbing method. Therefore, there is no possibility that the PZT film 42 surface is damaged due to any flaw and so on.

Figure 8D:
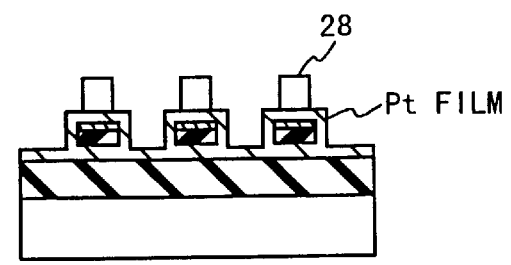

Next, as shown in FIG. 8D, a Pt film of about 1000 Å in thick is deposited by a sputtering method and then a TiN film (not illustrated) of about 500 Å in thick is deposited on the Pt film by a sputtering method. Subsequently, a resist pattern 28 is formed as an etching mask. In this case, the TiN film formed on the Pt film functions as the reflection preventing film in exposure. At the same time, the TiN film functions as a hydrogen diffusion preventing barrier for preventing the diffusion of hydrogen which causes the characteristic degradation by the ferroelectric film.

Figure 8E:
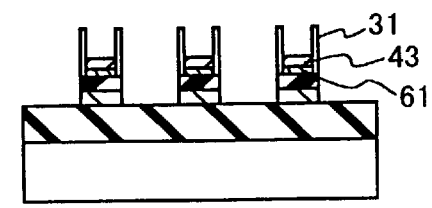

Next, As shown in FIG. 8E, the Pt noble metal protecting film 61, and the Pt film and the TiN film are collectively etched by the Ar ion milling method using the resist pattern 28 to form the upper capacitor electrode 43. In this case, the width of the upper capacitor electrode 43 is made to be smaller than that of the lower capacitor electrode 41.

Figure 8F:
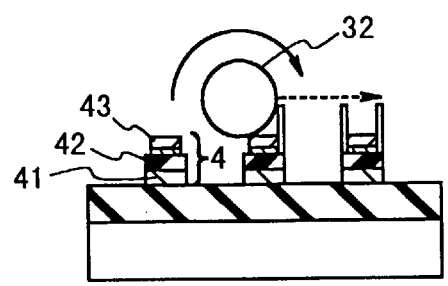

After the etching process of the upper capacitor electrode 43, side wall deposition film which contains Pt as a main component is remained in the side walls of the resist pattern mask 28. When the resist pattern 28 is removed by an ashing method using the oxygen plasma, rabbit's ear-like side wall deposition films 31 are remained. The ear-like side wall deposition films 31 are removed by the scrubbing method using the rotating brush 32 as shown in FIG. 8F. In this manner, the ferroelectric capacitor 4 which is composed of the PZT film 42 which is sandwiched by the lower capacitor electrode 41 of Pt and the upper capacitor electrode 43. Note that the noble metal protecting film 61 formed on the PZT film is omitted from the figures for simplification of the figures.

Figure 7F:
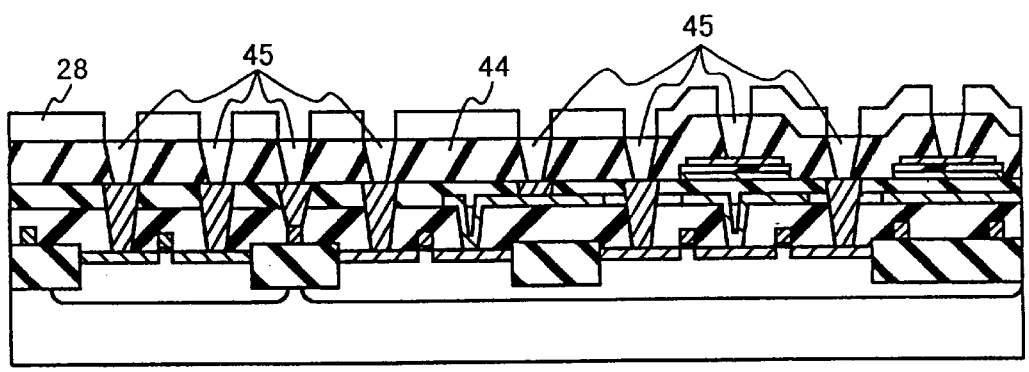

As shown in FIG. 7F, after the ferroelectric capacitor 4 is formed, a spin on glass (SOG) film is formed to have the thickness of about 1000 Å and then annealing is performed at 350° C. in an oxygen ambient. Thereafter, a silicon oxide film having the thickness of about 3000 Å is deposited by an ozone TEOS-CVD method using tetraethoxyorthosilicate (TEOS) as a material gas. In this manner, a laminate cover film 44 composed of the SOG film and the silicon oxide film is deposited. Opening portions (to be referred to as via-holes 45 hereinafter) are formed to penetrate the cover film 44 to the upper capacitor electrode 43 and the heat-resistant metal plugs 40 using a photo-resist as a mask 28.

Figure 7G:
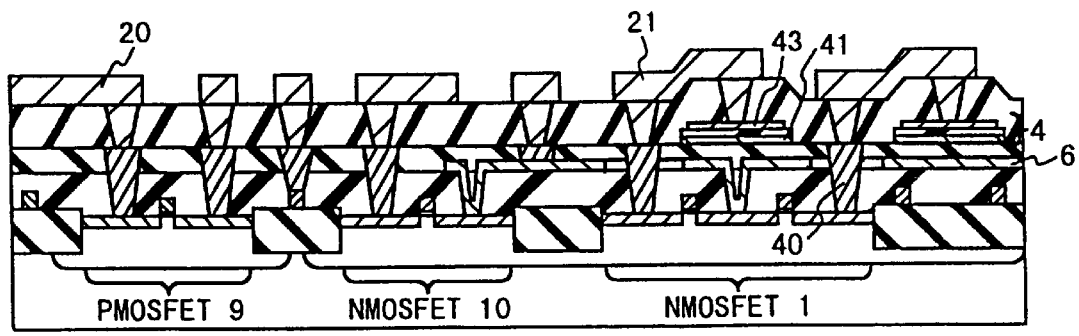

Finally, as shown FIG. 7G, a Ti film of 500 Å in thick, a TiN film of 500 Å thick, an Al film of 4000 Å thick and a TiN film of 300 Å thick are formed by sputtering methods, while the via-holes 45 are filled therewith. The Ti/TiN/Al/TiN films are subjected to a dry etching method using a mixture gas of $Cl_2$ and $BCl_3$ so that an aluminum wiring pattern 20 and a local wiring pattern 21 are formed.

Through a series of processes mentioned above, the capacitor section 4 in which the PZT film 42 sandwiched by the lower capacitor electrode 41 as the plate electrode 3 and the upper capacitor electrode 43 as the charge storing electrode 2 is formed on the bit line 6. Also, the local wiring 21 is connected to the upper capacitor electrode 43 and the diffusion layers of the NMOSFET transfer gates 1 via the heat-resistant metal plugs 40. In addition, the MOS transistors of the CMOS logic circuit section 8 are connected to each other by the aluminum wiring pattern 20 through the heat-resistant metal plugs 40.

In this manner, the FRAM device has the structure in which the aluminum wiring pattern 20 and the local wiring pattern 21 are connected through the heat-resistant metal plugs 40 which has been formed before the ferroelectric capacitor 4 is formed. Because the heat-resistant metal plugs 40 each of which is filled with the tungsten in advance are present in the deep opening portions to the diffusion layers and so on, electric conductivity can be sufficiently established by the aluminum film wiring patterns 20 and 21 by the sputtering method. Note that the heat-resistant metal plugs forming process by the metal CVD which needs a reducing ambient has been performed before the ferroelectric capacitor section 4 is formed. For this reason, the characteristic degradation of the ferroelectric capacitor 4 because of exposure of the ferroelectric capacitor 4 to the reducing ambient is not caused. In the first embodiment, the heat-resistant contact plugs are formed of the tungsten by the CVD method. However, the heat resistant contact plugs may be formed of conductive inorganic materials such as titanium nitride, ruthenium oxide, and iridium oxide by a CVD method or a reactive sputtering method. Further, in this embodiment, the PZT which is ferroelectric substance is used as the capacitive film. However, the present invention in which the heat-resistant metal plugs are formed prior to the formation of the capacitor section, can be applied to the DRAM device which uses the composite metal oxide having a high dielectric constant such as $(Sr, Ba)TiO_3$ in which the dielectric characteristics is easily degraded because of generation of oxygen defects in the reducing ambient.

Next, the FRAM device according to the second embodiment of the present invention will be described below. In the second embodiment, a ferroelectric capacitor section is formed on a bit line in a memory circuit section to have a lower electrode 41 as a charge storing electrode and an upper electrode 43 as a plate electrode 3. The lower electrode 41 is directly connected to a heat resistant metal plug which is connected to a diffusion layer of an NMOSFET transfer gate 1. Also, heat resistant metal plugs are provided for diffusion layers of the MOS transistors in the CMOS logic circuit section and are connected to the aluminum wiring pattern 20.

FIGS. 9A to 9E are cross sectional views illustrating the manufacturing process of the FRAM device according to the second embodiment of the present invention.

Figure 9A:
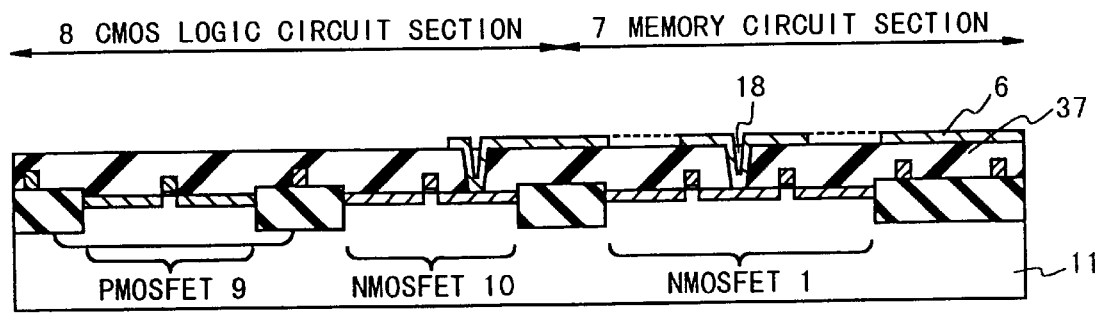
FIGS. 9A to 9E are cross sectional views to explain the method of manufacturing the FRAM device according to a second embodiment of the present invention.

First, referring to FIG. 9A, using the same process as the first embodiment, the NMOSFET transfer gates 1 of the memory circuit section 7 and the NMOSFET 10 and PMOSFET 9 of the CMOS logic circuit section 8 are formed on the P-type silicon substrate 11. Next, an opening portion (to be referred to as a bit contact hole 18 hereinafter) is formed to penetrate the first BPSG film 37 which has been flattened by the CMP method, to the diffusion layer of the NMOSFET transfer gate 1. Then, the tungsten silicide ($WSi_x$) film of about 2000 Å is deposited by the sputtering method. Subsequently, after phosphor ions are implanted to form an $n^+$ region (not illustrated) in the bottom portion of the bit contact hole 18, a bit line 6 of the tungsten silicide film is formed by a dry etching.

Figure 9B:
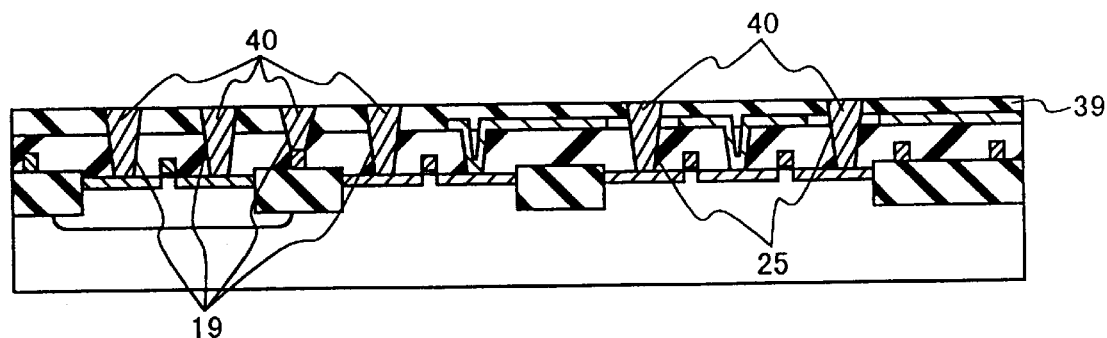

Next, as shown in FIG. 9B, a second BPSG film 39 is deposited and the surface of the second BPSG film 39 is flattened by reflowing and the CMP method. Thereafter, using a photo-resist 28 as a mask, opening portions (to be referred to as capacitor contact holes 25 hereinafter) are formed to penetrate the first and second BPSG films 37 and 39 to the diffusion layers of the NMOSFET transfer gates 1 in the memory circuit section 7. Also, opening portions (to be referred to as CMOS contact holes 19 hereinafter) are formed to penetrate the first and second BPSG films 37 and 39 to the $P^+$ diffusion layers, $n^+$ diffusion layers and pattern coupled to a gate electrode of the CMOS circuit section 8.

Next, a barrier film (not illustrated) which is composed of a Ti film 500 Å and a TiN film of 500 Å is first deposited by a collimator sputtering method and then the barrier film is heated by a lamp annealing in a nitrogen ambient. Note that it is important that silicide forming reaction is caused to occur at the interface between the diffusion layer and the barrier layer so that a $TiSi_x$/TiN (not illustrated) is formed. The heating condition may be same as in the first embodiment. Next, a tungsten film (not illustrated) is deposited on the surface of the second BPSG film 39 by the blanket CVD method such that the opening portions 19 and 25 are filled with the tungsten film. Thereafter, the barrier film and tungsten film on second BPSG film 39 are removed by a selective tungsten CMP method. As a result, the heat-resistant metal plugs 40 can be obtained in which the opening portions 19 and 25 are filled with the tungsten film.

Figure 9C:
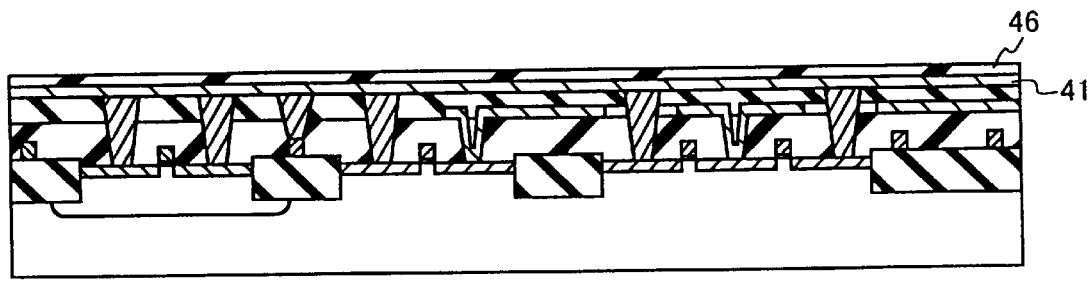

Next, as shown in FIG. 9C, a Ti film (not illustrated) of 200 Å thick and a Pt film of 1000 Å thick are deposited by a sputtering method for formation of the lower capacitor electrode film 41 as the charge storing electrode. Then, the annealing is performed at 400 to 500° C. in a nitrogen ambient. As a result, the Pt film is crystalized. At the same time, an oxidation resistant layer (not illustrated) of TiW is formed in the interface between the Ti film of the lower capacitor electrode film 41 and the heat-resistant metal plug 40. At this time, the Ti film of the Ti/Pt film 41 on the second BPSG film 39 is nitrided to form a TiN layer. Therefore, the lower capacitor electrode film 41 is formed as the TiN/Pt film through the above process.

Next, as shown in FIG. 9C, a $SrBi_2Ta_2O_9$ film 46 is deposited by an RF sputtering method. In this case, it is necessary that an Ar gas is used which contains $O_2$ gas of about 20% such that generation of oxygen defects during the sputtering can be prevented. Then, a Pt film (not illustrated) as a surface protecting film is deposited on the $SrBi_2Ta_2O_9$ film 46. Subsequently, the deposited $SrBi_2Ta_2O_9$ film 46 is annealed at 700° C. for 30 sec. in an ambient containing oxygen gas for the crystallization.

Figure 9D:
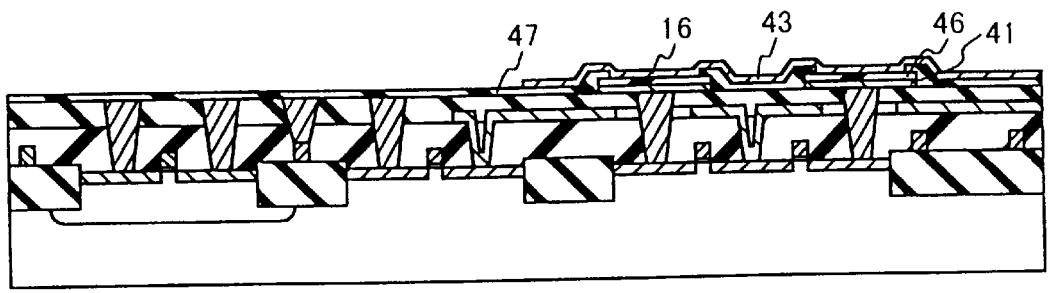

Next, as shown in FIG. 9D, the $SrBi_2Ta_2O_9$ film 46 and the lower electrode film 41 of the Pt film are collectively patterned by the Ar ion milling method using a photo-resist pattern as a mask, as in the first embodiment. When the photo-resist mask 28 is removed by the oxygen plasma peeling method, the side wall deposition films 31 on the side walls of the photo-resist pattern are remained and then removed by the scrubbing method using a rotating brush 32.

Next, on the patterned $SrBi_2Ta_2O_9$ film, a spin on glass (SOG) film is formed to have the thickness of about 1000 Å and then a silicon oxide film having the thickness of about 3000 Å is deposited by the ozone TEOS-CVD method. The SOG film and the silicon oxide film constitute the first cover film 47. Subsequently, opening portions (to be referred to as plate electrode holes 16) are formed to penetrate the first cover laminate film 47 composed of the SOG film and the silicon oxide film to the upper electrode films. Thereafter, annealing is performed at about 400° C. in an oxygen or nitrogen ambient.

Next, a Pt film as the plate electrode 3 of about 2000 Å in thick is deposited by a sputtering method and then a TiN film (not illustrated) of about 500 to 2000 Å thick is deposited on the Pt film by a sputtering method. Subsequently, a resist pattern is formed as an etching mask. In this case, the TiN film formed on the Pt film functions as the reflection preventing film in exposure. At the same time, the TiN film functions as a hydrogen diffusion preventing barrier for preventing the diffusion of hydrogen. Then, the plate electrode film is patterned by a reactive ion etching method using a mixture gas of $Cl_2$ and $BCl_3$. After the photo-resist mask is ashed and removed by an oxygen plasma, the remained side wall deposition films are removed by a brush scrubbing method, if necessary. The Ar ion milling method described in the first embodiment may be used in order to pattern the plate electrode.

Figure 9E:
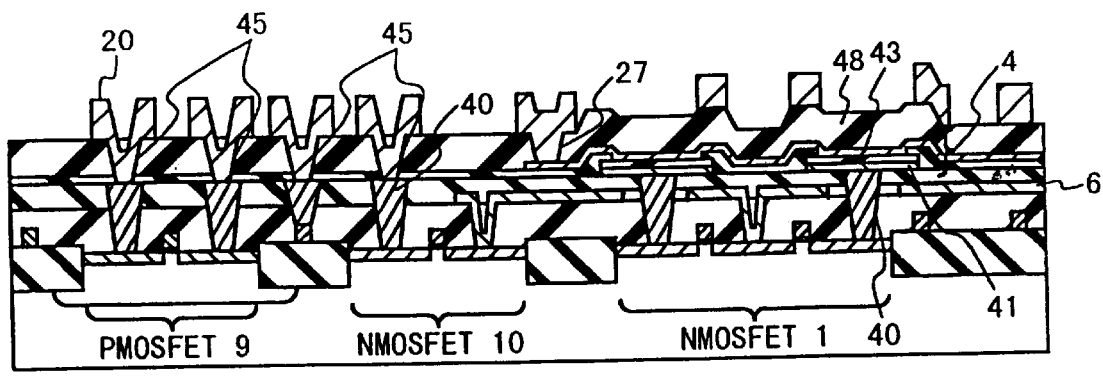

Finally, as shown in FIG. 9E, an oxide film is deposited as the second cover film 48 by the ozone TEOS-CVD method to have the thickness of about 3000 Å. Subsequently, an opening portion (to be referred to as plate contact hole hereinafter) 45 is formed to penetrate the second cover film 48 to the upper capacitor electrode 43 using a resist film mask. Also, opening portions (to be referred to as via-holes hereinafter) 45 are formed to penetrate the second cover film 48 to the heat-resistant metal plugs 40. Thereafter, a Ti film of 500 Å thick, a TiN film of 500 Å thick, an Al film of 4000 Å thick and a TiN film of 300 Å thick are formed by a sputtering method, while the plate contact hole 45 and the via-holes 45 are filled therewith. The Ti/TiN/Al/TiN films are subjected to a dry etching method using a mixture gas of $Cl_2$ and $BCl_3$ so that an aluminum wiring pattern 20 and a local wiring pattern 27 are formed.

Through a series of processes mentioned above, the capacitor section 4 in which the $SrBi_2Ta_2O_9$ film 42 sandwiched by the lower capacitor electrode 41 as the charge storing electrode 2 and the upper capacitor electrode 43 as the plate electrode 3 is formed on the bit line 6. Also, the charge storing electrodes 2 are connected to the diffusion layer of the NMOSFET transfer gates 1 via the heat-resistant metal plugs 40, respectively. In addition, the MOS transistors 9 and 10 of the CMOS logic circuit section 8 are connected to each other by the aluminum wiring 20 through the heat-resistant metal plugs 40.

In this manner, the FRAM device according to the second embodiment has, for the deep opening portions to the diffusion layers, the heat-resistant metal plugs 40 which has been formed before the ferroelectric capacitor 4 is formed. Therefore, electric conductivity can be sufficiently established by the aluminum film wiring patterns 20 and 27 by the sputtering method. Further, in the FRAM device according to the second embodiment, because the ferroelectric capacitor section 4 is formed straightly above the diffusion layer of the transfer gate 1 via the heat resistant metal plug 40, the local wiring pattern 21 as in the first embodiment is not required. For this reason, the capacitor cell can be made small in area so that the memory circuit section 7 can be formed with a high density.

Next, the method of manufacturing the FRAM device according to the third embodiment of the present invention will be described with reference to FIGS. 10A to 10H. In the FRAM device according to the third embodiment, the local wiring pattern of the CMOS logic circuit section and the bit line of the memory circuit section are a heat resistant wiring pattern plug which is formed by collectively filling the opening portions to the diffusion layers and a trench pattern connecting between the opening portions with a heat resistant metal.

FIGS. 10A to 10H are cross sectional views illustrating the manufacturing process of the FRAM device according to the third embodiment of the present invention.

Figure 10A:
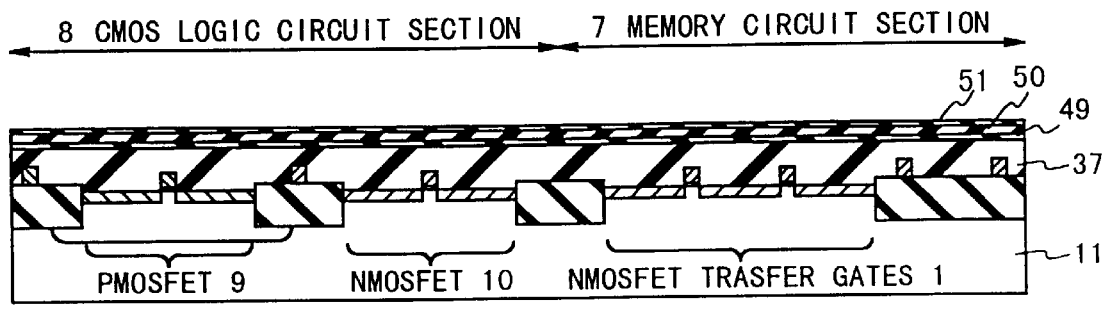
FIGS. 10A to 10H are cross sectional views to explain the method of manufacturing the FRAM device according to a third embodiment of the present invention.

First, referring to FIG. 10A, using the same process as the first embodiment, the NMOSFET transfer gates 1 of the memory circuit section 7 and the NMOSFET 10 and PMOSFET 9 of the CMOS logic circuit section 8 are formed on the P-type silicon substrate 11. Next, the first BPSG film 37 is deposited and then is flattened by a CMP method. Thereafter, the first silicon nitride film 49 of 500 Å, a silicon oxide film 50 of 4000 Å and the second silicon nitride film 51 of 500 Å are deposited in order on the first BPSG film 37.

Figure 10B:
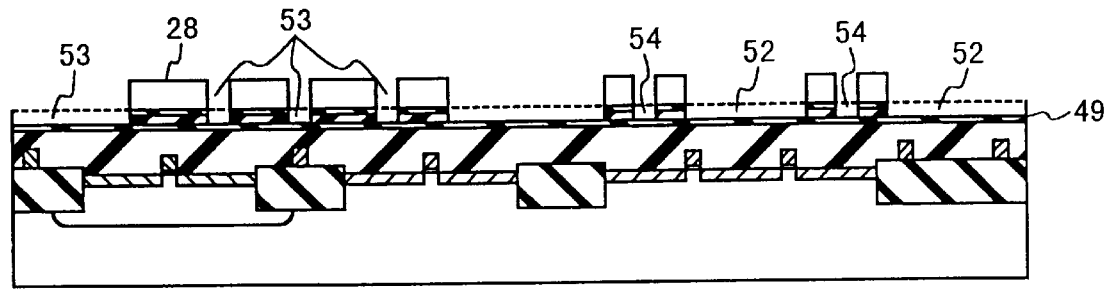

Next, as shown in FIG. 10B, after the second silicon nitride film 51 is etched with a fluoric system gas such as $CHF_3$ using a resist pattern as a mask, the silicon oxide film 50 is etched by a reactive ion etching using a gas in which a $CHF_3$ gas and a CO gas are mixed in a ratio of 1:3. By using the CO containing reactive gas, when the first silicon nitride film 49 appears, a carbon film is selectively deposited on the first silicon nitride film and the etching rate decreases remarkably. That is, the first silicon nitride film 49 functions as an etching stopper layer of the silicon oxide film 50. The first silicon nitride film 49 is etched using the fluoric system gas as an etching gas again and then the photo-resist 28 is removed in the oxygen plasma.

Through a series of above processes, a trench pattern 52 for the bit line wiring pattern and other wiring patterns, a trench pattern 53 for a local wiring pattern of the CMOS logic circuit section 8 are formed. Also, opening portions (to be referred to as first capacitor contact holes hereinafter) 54 for the capacitor contact holes are formed in the interlayer insulating film having a laminate structure hich is composed of the first silicon nitride film 49, the silicon oxide film 50 and the second silicon nitride film 51.

Figure 10C:
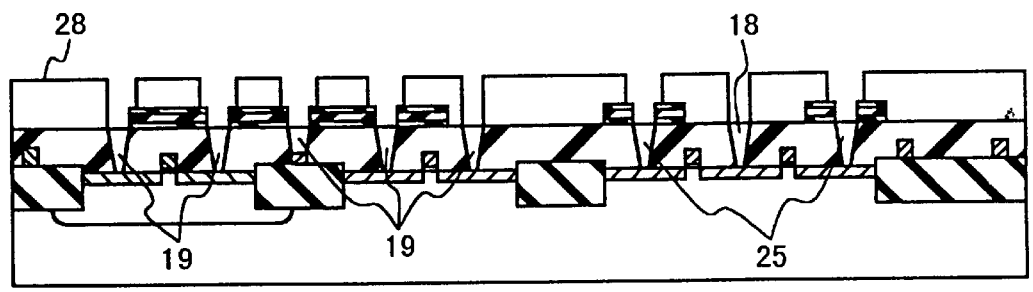

Next, as shown in FIG. 10C, opening portions 18, 25 and 19 are formed to penetrate the first BPSG film 37 from the bottom of the above-mentioned trench patterns 52 and 53 and the bottom of the opening portion 54 to the diffusion layers of the MOS transistors and a pattern connected to the gate electrode thereof using the resist pattern 28 as a mask. Through a series of above processes, the trench structure is obtained in which the openings 18 and 19 formed to penetrate the first BPSG film to the transistor diffusion layers are connected to the trench patterns 52 and 53 formed in the above laminate structure interlayer insulating film. Further, the opening portions 25 formed through the fist BPSG film and the laminate layer opening portions composed of the first capacitor contact holes 54 are formed.

Figure 10D:
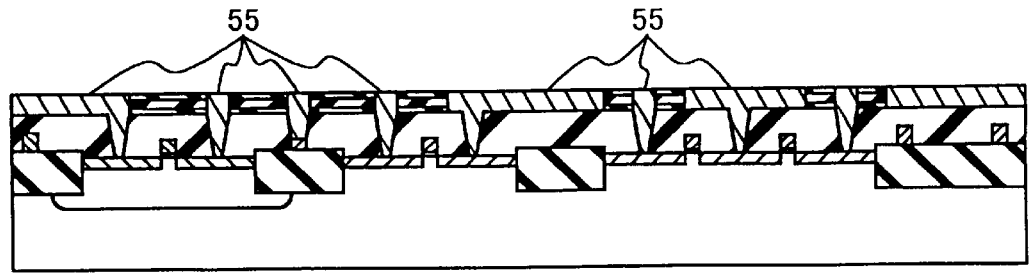

Next, as shown in FIG. 10D, after the resist pattern 28 is removed, a barrier film (not illustrated) which is composed of a Ti film of 500 Å and a TiN film of 500 Å is first deposited by a collimator sputtering method. Then, the barrier film is heated by a lamp annealing in a nitrogen ambient. Next, a tungsten film (not illustrated) is deposited on the surface of the second silicon nitride film by the blanket CVD method such that the opening portions are filled with the tungsten film. Thereafter, the barrier film and tungsten film on second silicon nitride film 51 are removed by a selective tungsten CMP method. As a result, the heat-resistant metal contact plugs and wiring plugs can be obtained in which the opening portions 18, 19, 25 and 54 and the trench portions 52 and 53 are filled with the tungsten film.

Figure 10E:
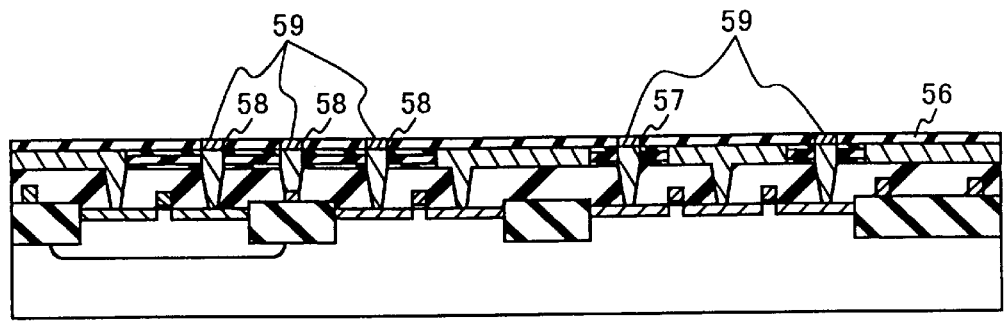

Next, as shown in FIG. 10E, the second interlayer insulating film 56 is deposited. Opening portions 57 and 58 (to be referred to as capacitor via-holes 57 and CMOS via-holes 58) to the above heat-resistant wiring plugs 55 are formed to penetrate the second interlayer insulating film 56. Next, the Ti/TiN barrier film (not illustrated) is formed by the collimator sputtering method and then the tungsten film is deposited by the blanket CVD method. Thereafter, the tungsten film and the Ti/TiN barrier film are removed by the CMP method. As a result, the second heat-resistant metal plugs 59 formed by filling the opening portions 57 and 58 with the tungsten are formed.

Figure 10F:
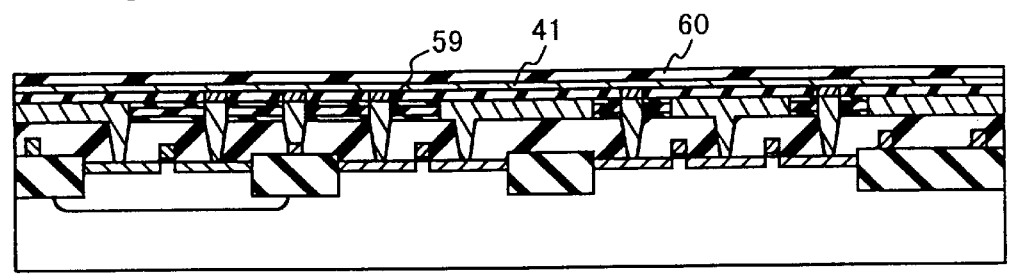

Next, as shown in FIG. 10F, a Ti film of 200 Å thick and a Pt film of 2000 Å thick are deposited by a sputtering method for formation of the lower capacitor electrode film 41 as the charge storing electrode. Then, the annealing is performed at a temperature of 400 to 600° C. in a nitrogen ambient. As a result, the Pt film is crystalized. At the same time, an oxidation resistant layer (not illustrated) of TiW is formed in the interface between the Ti film of the lower capacitor electrode film 41 and the eat-resistant metal plug 40. At this time, the Ti film of the Ti/Pt film 41 on the second BPSG film 56 is nitrided to form a TiN layer. Therefore, the lower capacitor electrode film 41 becomes the TiN/Pt film through the above process.

Next, a $Bi_4Ta_3O_{12}$ film 60 is deposited by an RF sputtering method to have the thickness of about 2000 Å. In this case, it is necessary that an Ar gas which contains $O_2$ gas of about 20% is used such that generation of oxygen defects during the sputtering can be prevented. Then, a Pt film (not illustrated) as a surface protecting film is deposited on the $SrBi_2Ta_2O_9$ film 60. Subsequently, the deposited $Bi_4Ti_3O_{12}$ film 60 is lamp annealed at a temperature of 400 to 600° C. for 30 sec. in an ambient containing oxygen gas for the crystallization.

Figure 10G:
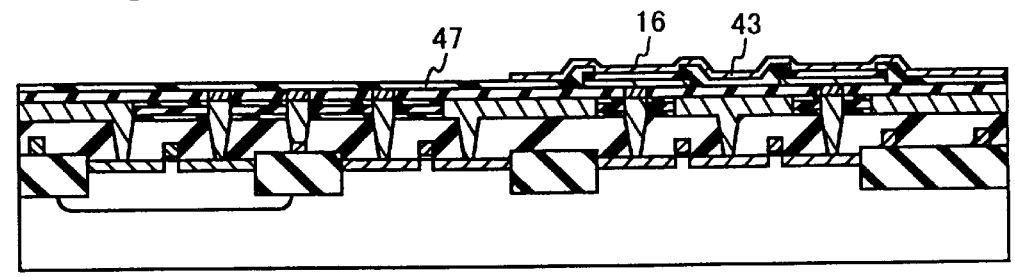

Next, as shown in FIG. 10G, the $Bi_4Ti_3O_{12}$ film 60 and the lower electrode film 41 of the Pt film are collectively patterned by the Ar ion milling method using a resist pattern as a mask. When the resist mask is removed by the oxygen plasma peeling method, the side wall deposition films 31 on the side wall of the photo-resist pattern are removed by the scrubbing method using a rotating brush 32, as described above.

Next, the first cover film 47 is deposited. The first cover film 47 is composed of the SOG film of 1000 Å and the oxide film (1000 Å) formed by the ozone TEOS-CVD method on the $Bi_4Ti_3O_{12}$ film 60 as the patterned ferroelectric film. Then, opening portions (to be referred to as plate electrode holes hereinafter) 16 are formed to reach the patterned $Bi_4Ti_3O_{12}$ film capacitor section. Subsequently, the plate electrode as the upper capacitor electrode 43 composed of a Pt film of 2000 Å thick and a TiN film of 500 Å thick are deposited by a sputtering method. Thereafter, the upper capacitor electrode as the plate electrode film is patterned by a reactive ion etching method using a mixture gas of $Cl_2$ and $BCl_3$. After the photo-resist mask is ashed and removed by an oxygen plasma, the remained side wall deposition films are removed by a brush scrubbing method, if necessary. The Ar ion milling method described in the first embodiment may be used in order to pattern the plate electrode. As a result, the plate electrode 3 is obtained.

Figure 10H:
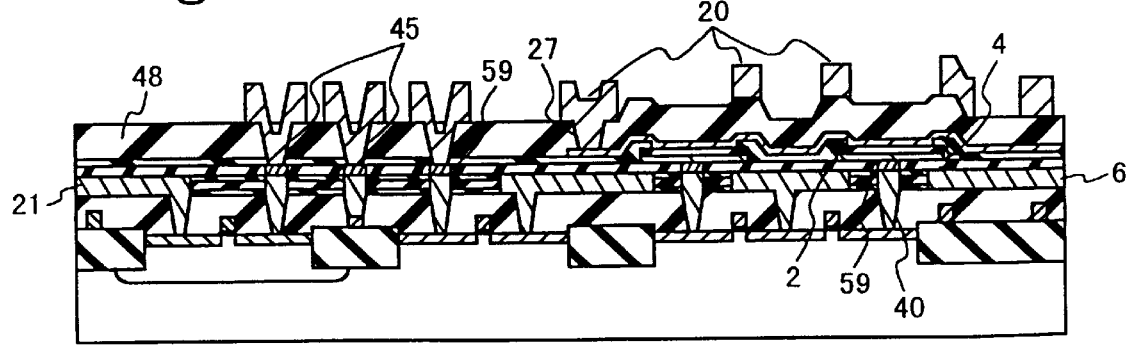

Finally, as shown in FIG. 10H, a multi-layer oxide film is deposited as the second cover film 48 by the ozone TEOS-CVD method and the plasma TEOS-CVD method to have the thickness of about 3000 Å. Subsequently, an opening portion (to be referred to as a plate contact hole hereinafter) 27 is formed to penetrate the second cover film 48 to the upper capacitor electrode 43 using a resist film mask. Also, at the same time, opening portions (to be referred to as via-holes hereinafter) 45 are formed to penetrate the second cover film 48 and first cover film 47 to the heat-resistant metal plugs 40. Thereafter, a Ti film of 500 Å thick, a TiN film of 500 Å thick, an Al film of 4000 Å thick and a TiN film of 300 Å thick are formed by a sputtering method, while the plate contact hole and the via-holes 45 are filled therewith. The Ti/TiN/Al/TiN films are subjected to a dry etching method using a mixture gas of $Cl_2$ and $BCl_3$ so that an aluminum wiring pattern 20 is formed.

Note that the portions which are described in detail in the second and third embodiments are the same as those in the first embodiment.

In the FRAM device of the third embodiment, in addition to the heat-resistant contact plugs formed in the deep opening portions to the diffusion layers, there is provided the heat resistant wiring pattern plug formed by filling the trench pattern with heat resistant material and connecting between the contact plugs. In the embodiment, because the heat-resistant wiring pattern plug is formed before the ferroelectric capacitor section forming process, the deep opening portions to the diffusion layers are not required to be filled with an aluminium layer by a sputtering method. Electric conductivity can be sufficiently established through the heat-resistant wiring plugs by the aluminum film 20 formed by the sputtering method. Further, because the ferroelectric capacitor section 4 is formed above the diffusion layer of the transfer gate 1 and directly connected to the heat-resistant wiring plug 40 as in the second embodiment, the local wiring pattern 21 is not necessary unlike the first embodiment. Therefore, the capacitor cell can be made small so that the memory circuit section can be formed with a high density.

In first and second embodiments, the heat resistant metal plugs 40 composed of tungsten are formed only and the heat-resistant metal plugs 40 are connected to each other by the aluminum wiring pattern 20. In the third embodiment, however, the heat-resistant wiring pattern plug connects between the heat-resistant metal plugs through the trench pattern which is filled with the heat-resistant metal. Therefore, the heat-resistant wiring pattern plug can be used for the local wiring of the CMOS logic circuit section 8 and the bit line of the memory circuit section 7. Thus, the freedom for wiring increases. In this manner, the present embodiment is effective in a case where the memory circuit section 7 having the ferroelectric capacitor and the CMOS logic circuit section 8 are to be connected and a microprocessor is formed in which the CMOS-SRAM cache memory is mounted for compensating the processing speed difference between the FRAM block and the CMOS logic circuit.

As described above, according to the present invention, before the capacitor section is formed, heat-resistant metal plugs are formed to the diffusion layers of the NMOSFET transfer gates of the memory circuit section and to the diffusion layers of the MOSFETs of the CMOS logic circuit section. Therefore, even in a case of an integrated circuit which includes a memory circuit section using a ferroelectric film which is weak against a reducing ambient such as a hydrogen gas, the electric conductivity can be reliably established without degrading the characteristic of the memory circuit section. Further, since the ferroelectric capacitor section is formed after the opening portions and the trench pattern connecting between the opening portions, are filled with the heat-resistant material to form wiring pattern plug, the electric conductivity to the diffusion layers cannot be only established but also the freedom of wiring can be increased. As a result, there can be easily manufactured a multi-function semiconductor integrated circuit in which the freedom of wiring is required and the memory circuit section and the CMOS circuit section are mixedly provided.

What is claimed is:

1. A method of manufacturing a semiconductor device comprising the steps of:

forming on a substrate a CMOS section comprising an N-channel MOS transistor and a P-channel MOS transistor and a memory section comprising at least a transfer gate MOS transistor;

forming a plurality of conductive plugs to penetrate a laminate insulating film, at least one of said plurality of conductive plugs being associated with, and connected to, one each of said MOS transistors in said CMOS section and said memory section, said laminate insulating film being comprised of a first insulating film and a second insulating film;

forming a capacitor section on said laminate insulating film, said capacitor section being comprised of an upper electrode, a dielectric film and a lower electrode;

forming a third insulating film on said laminate insulating film and said capacitor section; and forming a wiring pattern on said third insulating film to partially penetrate said second insulating film and connect to said plurality of conductive plugs.

2. A method according to claim 1, wherein said step of forming a plurality of conductive plugs includes:

forming said first insulating film on said substrate, said CMOS section and said memory section;

forming said second insulating film on said first insulating film;

forming contact holes to penetrate said first and second insulating films to said MOS transistors; and filling said contact holes with at least one conductive material.

3. A method according to claim 2, wherein said step of filling said contact holes includes:

forming a barrier film in said contact holes; and forming a heat resistant material film on said barrier film in said contact holes.

4. A method according to claim 3, wherein said step forming a barrier film includes heating said barrier film to form a silicide layer.

5. A method according to claim 1, wherein said step of forming a plurality of conductive plugs includes:

forming said first insulating film on said substrate, said CMOS section and said memory section;

forming first contact holes to penetrate said first insulating films to said MOS transistors;

filling said first contact holes with at least one conductive material to form first contacts;

forming said second insulating film on said first insulating film;

forming second contact holes to penetrate said second insulating films to said first contacts; and filling said second contact holes with at least one conductive material.

6. A method according to claim 5, wherein said step of filling said first contact holes includes:
   forming a barrier film in said first contact holes; and
   filling said contact holes with a heat resistant material film on said barrier film, and
   wherein said step of filling said second contact holes includes:
      forming a barrier film in said second contact holes; and
      filling said second contact holes with a heat resistant material film on said first contacts.

7. A method according to claim 1, further comprising the steps of:
   forming said first insulating film on said substrate, said CMOS section and said memory section;
   forming a bit line wiring pattern on said first insulating film to penetrate said first insulating film to said transfer gate MOS transistor; and
   forming said second insulating film on said first insulating film to complete said laminate insulating film.

8. A method according to claim 1, further comprising the steps of:
   forming said first insulating film on said substrate, said CMOS section and said memory section;
   etching said first insulating film to form a trench pattern and to form first contact holes to said MOS transistors, a part of said first contact holes being connected to said trench pattern;
   filling said trench pattern and first contact holes with a film composed of conductive heat resistant material;
   forming said second insulating film on said first insulating film;
   forming second contact holes to penetrate said second insulating films to remaining ones of said first contacts which are not connected to said trench pattern; and
   filling said second contact holes with a film composed of conductive heat resistant material to complete said plurality of conductive plugs.

9. A method according to claim 8, wherein a part of said trench pattern which is filled said film composed of conductive heat resistant material at least one conductive material is a bit line connected to said transfer gate MOS transistor.

10. A method according to claim 1, wherein said step of forming a capacitor section includes forming a capacitor section on said laminate insulating film such that said lower electrode is positioned on and connected to one of said plurality of conductive plugs.

11. A method according to claim 1, wherein said step of forming a capacitor section includes forming said lower electrode, and
   wherein said step of forming said lower electrode includes:
      depositing first and second metal films on said laminate insulating film; and
      forming an oxidation resistant layer from said first metal film and crystallizing said second metal film.

12. A method according to claim 1, wherein said of forming a capacitor section includes:
   forming a lower electrode conductive film on said laminate insulating film;
   forming a dielectric film on said lower electrode conductive film;
   forming a protective conductive film on said dielectric film;
   patterning said lower electrode conductive film, said dielectric film and said protective film;
   forming an upper electrode conductive film; and
   patterning said upper electrode film to form said upper electrode.

13. A method according to claim 12, further comprising the step of depositing a hydrogen diffusion preventing conductive film, and
   where said patterning said upper electrode film includes patterning said hydrogen diffusion preventing conductive film at the same time as patterning said upper electrode film.

14. A method of manufacturing a semiconductor device according to claim 1, wherein each of said plurality of conductive plugs have a height substantially equal to a greatest thickness of said laminate insulating film.

15. A method of manufacturing a semiconductor device according to claim 1, wherein each of said plurality of conductive plugs have a first end closest to said substrate and a second end away from said substrate, and said second end of said conductive plugs is substantially coincident height as said top surface of said laminate insulating film.

16. A method of manufacturing a semiconductor device according to claim 1, wherein said dielectric film includes a noble metal protecting film on a ferroelectric film.

17. A method of manufacturing a semiconductor device according to claim 4, wherein said dielectric film is covered on an upper surface by a noble metal protecting film.

18. A method of manufacturing a semiconductor device according to claim 4, wherein each of said plurality of conductive plugs have a first end closest to said substrate and a second end away from said substrate, and said second end of said conductive plugs is substantially coincident height as said top surface of said laminate insulating film.

19. A method of manufacturing a semiconductor device according to claim 1, wherein each of said plurality of first conductive plugs comprises:
   a barrier film composed of a titanium silicide layer and a titanium nitride layer and a tungsten film.

* * * * *